United States Patent
Takase et al.

(10) Patent No.: US 10,497,739 B2
(45) Date of Patent: Dec. 3, 2019

(54) IMAGE CAPTURE DEVICE INCLUDING PHOTOELECTRIC CONVERTER SUPPORTED BY SEMICONDUCTOR SUBSTRATE

(71) Applicant: Panasonic Intellectual Property Management Co., Ltd., Osaka (JP)

(72) Inventors: Masayuki Takase, Osaka (JP); Yuuko Tomekawa, Osaka (JP); Yoshihiro Sato, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/174,156

(22) Filed: Oct. 29, 2018

(65) Prior Publication Data

US 2019/0181178 A1 Jun. 13, 2019

(30) Foreign Application Priority Data

Dec. 13, 2017 (JP) .................. 2017-238197

(51) Int. Cl.
 *H04N 5/357* (2011.01)
 *H01L 27/146* (2006.01)
 (Continued)

(52) U.S. Cl.
 CPC .. *H01L 27/14643* (2013.01); *H01L 27/14609* (2013.01); *H01L 27/14612* (2013.01);
 (Continued)

(58) Field of Classification Search
 CPC ....... H04N 5/357; H04N 5/363; H01L 27/146
 (Continued)

(56) References Cited

U.S. PATENT DOCUMENTS

2013/0313410 A1  11/2013  Goto
2015/0249106 A1*  9/2015  Jiroku ............... H01L 31/02240
                                                 257/435
(Continued)

FOREIGN PATENT DOCUMENTS

| JP | 2012-151771 | 8/2012 |
| JP | 2016-127265 | 7/2016 |
| JP | 2017-135693 | 8/2017 |

*Primary Examiner* — Anthony J Daniels
(74) *Attorney, Agent, or Firm* — McDermott Will & Emery LLP

(57) ABSTRACT

An image capture device includes pixels and a signal line that is arranged across two or more of the pixels. Each pixel includes: a semiconductor substrate, a photoelectric converter including a first electrode, a second electrode, and a photoelectric conversion layer; a first transistor including first and second impurity regions in the substrate; a wiring layer between the substrate and the second electrode; and a capacitor arranged between the wiring layer and the substrate in a normal direction of the substrate and including a third electrode, a fourth electrode between the third electrode and the substrate, and a dielectric layer. The first impurity region is electrically connected to the second electrode, the fourth electrode is electrically connected to one of the first and second impurity regions, and at least either the third or fourth electrodes covers the first impurity region when viewed along the normal direction.

15 Claims, 13 Drawing Sheets

(51) Int. Cl.
*H04N 5/363* (2011.01)
*H04N 5/3745* (2011.01)
*H01L 49/02* (2006.01)
*H01L 29/08* (2006.01)

(52) U.S. Cl.
CPC ........ *H01L 27/14636* (2013.01); *H01L 28/60* (2013.01); *H04N 5/363* (2013.01); *H04N 5/37452* (2013.01); *H01L 29/0847* (2013.01); *H04N 5/37457* (2013.01)

(58) Field of Classification Search
USPC .................................................. 348/294, 374
See application file for complete search history.

(56) References Cited

U.S. PATENT DOCUMENTS

| | | | |
|---|---|---|---|
| 2016/0014364 A1* | 1/2016 | Tashiro | H04N 5/3741 348/300 |
| 2016/0037117 A1* | 2/2016 | Ono | H04N 5/2173 348/308 |
| 2016/0190188 A1* | 6/2016 | Murakami | H01L 27/14609 250/214 A |
| 2016/0191825 A1* | 6/2016 | Sato | H04N 5/363 348/250 |
| 2017/0214871 A1 | 7/2017 | Kanehara et al. | |
| 2017/0236842 A1* | 8/2017 | Matsuda | H01L 27/1222 257/43 |
| 2018/0039882 A1* | 2/2018 | Ikeda | H01L 27/14609 |
| 2018/0151760 A1* | 5/2018 | Tashiro | H01L 31/022425 |

* cited by examiner

IMAGE CAPTURE DEVICE INCLUDING PHOTOELECTRIC CONVERTER SUPPORTED BY SEMICONDUCTOR SUBSTRATE

BACKGROUND

1. Technical Field

The present disclosure relates to image capture devices. In particular, the present disclosure relates to an image capture device including photoelectric converters supported by a semiconductor substrate.

2. Description of the Related Art

An image capture device has been proposed that has a structure in which a photoelectric conversion layer is arranged above a semiconductor substrate in which a charge-coupled device (CCD) circuit or a complementary metal-oxide semiconductor (CMOS) circuit is formed. The image capture device that has a photoelectric conversion layer above a semiconductor substrate is called a laminate-type image capture device. For example, Japanese Unexamined Patent Application Publication No. 2012-151771 discloses a solid-state image capture element having such a laminate-type structure.

In the laminate-type image capture device, charge generated by photoelectric conversion is accumulated in a charge accumulation region, and a reading circuit including a CCD circuit or a CMOS circuit reads the accumulated charge. The photoelectric conversion layer is generally arranged on an insulating layer that covers a semiconductor substrate in which the reading circuit is formed. The photoelectric conversion layer on the insulating layer is electrically connected to the reading circuit via a connector provided in the insulating layer.

SUMMARY

One non-limiting and exemplary embodiment provides an image capture device including: a pixel region including a plurality of pixels; and a signal line that is arranged across two or more pixels of the plurality of pixels and that extends from an inside of the pixel region to an outside of the pixel region. Each of the plurality of pixels includes a semiconductor substrate, a photoelectric converter, a first transistor, a wiring layer, and a capacitor. The photoelectric converter is supported by the semiconductor substrate and includes a first electrode, a second electrode arranged closer to the semiconductor substrate than the first electrode, and a photoelectric conversion layer disposed between the first electrode and the second electrode. The first transistor includes a first impurity region arranged in the semiconductor substrate and a second impurity region arranged in the semiconductor substrate. The wiring layer is arranged between the semiconductor substrate and the second electrode and includes a part of the signal line. The capacitor is arranged between the wiring layer and the semiconductor substrate in a normal direction of the semiconductor substrate and includes a third electrode, a fourth electrode arranged between the third electrode and the semiconductor substrate, and a dielectric layer arranged between the third electrode and the fourth electrode. One of the first impurity region and the second impurity region is configured to function as a source region of the first transistor, and the other of the first impurity region and the second impurity region is configured to function as a drain region of the first transistor. The first impurity region is electrically connected to the second electrode. The fourth electrode is electrically connected to one of the first impurity region and the second impurity region. At least one electrode selected from the group consisting of the third electrode and the fourth electrode covers the first impurity region when viewed along the normal direction of the semiconductor substrate.

It should be noted that general or specific embodiments may be implemented as an element, a device, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
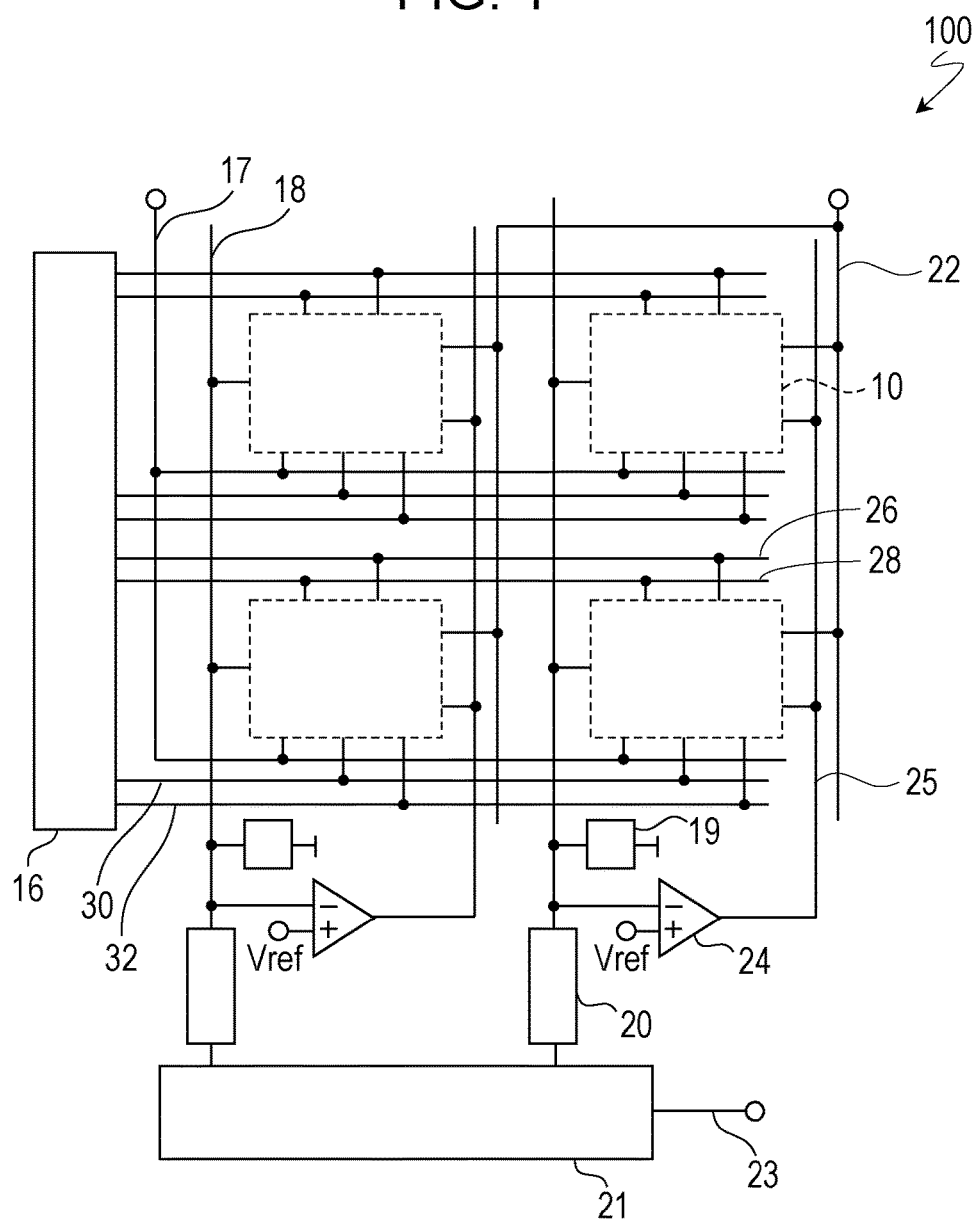
FIG. 1 illustrates an exemplary circuit configuration of an image capture device according to one embodiment of the present disclosure.

Before embodiments of the present disclosure are described in detail, a description will be given of an overview of one aspect of the present disclosure. The overview of one aspect of the present disclosure is as follows.

[Item 1] An image capture device according to item 1 in the present disclosure includes: a pixel region including a plurality of pixels; and a signal line that is arranged across two or more pixels of the plurality of pixels and that extends from an inside of the pixel region to an outside of the pixel region. Each of the plurality of pixels includes a semiconductor substrate, a photoelectric converter, a first transistor, a wiring layer, and a capacitor.

The photoelectric converter is supported by the semiconductor substrate and includes a first electrode, a second electrode arranged closer to the semiconductor substrate than the first electrode, and a photoelectric conversion layer disposed between the first electrode and the second electrode.

The first transistor includes a first impurity region arranged in the semiconductor substrate and a second impurity region arranged in the semiconductor substrate.

The wiring layer is arranged between the semiconductor substrate and the second electrode and includes a part of the signal line.

The capacitor is arranged between the wiring layer and the semiconductor substrate in a normal direction of the semiconductor substrate and includes a third electrode, a fourth electrode arranged between the third electrode and the semiconductor substrate, and a dielectric layer arranged between the third electrode and the fourth electrode.

One of the first impurity region and the second impurity region is configured to function as a source region of the first transistor, and the other of the first impurity region and the second impurity region is configured to function as a drain region of the first transistor.

The first impurity region is electrically connected to the second electrode.

The fourth electrode is electrically connected to one of the first impurity region and the second impurity region.

At least one electrode selected from the group consisting of the third electrode and the fourth electrode covers the first impurity region when viewed along the normal direction of the semiconductor substrate.

According to the configuration in item 1, it is possible to cause the third electrode and/or the fourth electrode to function as a light-shielding layer. Since at least one of the third electrode and the fourth electrode covers the first impurity region, light incidence on the first impurity region is suppressed or reduced to thereby make it possible to false-signal generation.

According to the configuration in item 1, since the capacitor is arranged closer to the semiconductor substrate than the wiring layer including a part of the signal line that extends to outside of the pixel region, it is possible to more effectively suppress or reduce incidence of light on the first impurity region, the light being obliquely incident on the pixel.

[Item 2] In the image capture device according to item 1, each of the plurality of pixels may further include a second transistor including a gate electrode electrically connected to the second electrode.

[Item 3] In the image capture device according to item 1 or 2, the at least one electrode selected from the group consisting of the third electrode and the fourth electrode may cover at least a part of the second impurity region when viewed along the normal direction.

According to the configuration in item 3, since at least one of the third electrode and the fourth electrode covers the second impurity region, light incidence on the second impurity region can be suppressed or reduced. As a result of suppression or reduction of light incidence on the second impurity region, it is possible to prevent the potential in a charge accumulation region from varying indirectly owing to generation of charge in the second impurity region.

[Item 4] The image capture device according to item 2 may further include:

a connector that electrically connects the second electrode to the first impurity region and electrically connects the second electrode to the gate electrode of the second transistor.

[Item 5] In the image capture device according to item 4, at least one electrode selected from the group consisting of the third electrode and the fourth electrode may include an opening.

According to the configuration in item 5, even when an interlayer insulating layer is provided between the photoelectric converter and the semiconductor substrate, and the capacitor is provided in the interlayer insulating layer, it is possible to suppress or reduce projection of the interlayer insulating layer at a portion in the pixel region relative to a portion in the peripheral region. That is, a level difference on the interlayer insulating layer between the pixel region and the peripheral region can be reduced, and, for example, an image quality reduction due to shading can be suppressed or reduced.

[Item 6] In the image capture device in item 5, the connector may penetrate the opening.

According to the configuration in item 6, it is possible to obtain a larger electrode area for the capacitor.

[Item 7] In the image capture device according to one of items 4 to 6, the fourth electrode may have a first surface that faces the third electrode and a second surface that is opposite to the first surface, and may be electrically connected to the second impurity region, and at least a part of the connector may face the second surface and may extend in a plane orthogonal to the normal direction.

According to the configuration in item 7, a capacitor can be formed between a part of the connector and a part of the fourth electrode.

[Item 8] In the image capture device according to item 7, the second surface of the fourth electrode may be electrically connected to the second impurity region.

According to the configuration in item 8, electrical coupling between the fourth electrode and another electrode and/or a wire can be suppressed or reduced to make it possible to further reduce noise mixing.

[Item 9] The image capture device according to item 7 or 8 may further include:

a feedback circuit that negatively feeds back an output of the second transistor, and the feedback circuit may include a third transistor including a source and a drain, and one of the source and the drain may be connected to the second impurity region.

According to the configuration in item 9, kTC noise can be canceled using the feedback circuit.

[Item 10] In the image capture device according to one of items 4 to 6, the fourth electrode may have a first surface that faces the third electrode and a second surface that is opposite to the first surface, and may be electrically connected to the connector.

[Item 11] In the image capture device according to item 10, the second surface of the fourth electrode may be connected to the connector.

According to the configuration in item 11, electrical coupling between the fourth electrode and another electrode and/or a wire can be suppressed or reduced to make it possible to further reduce noise mixing.

[Item 12] The image capture device according to the item 10 or 11 may further include:

a feedback circuit that negatively feeds back an output of the second transistor, and the second impurity region may be electrically connected to an output line of the feedback circuit.

According to the configuration in item 12, kTC noise can be cancel using the feedback circuit.

[Item 13] In the image capture device according to one of items 7 to 12, the dielectric layer may cover the first surface and a side surface of the fourth electrode, the side surface connecting the first surface and the second surface, and the third electrode may cover the side surface of the fourth electrode.

According to the configuration in item 13, electrical coupling between the fourth electrode and another electrode and/or a wire can be suppressed or reduced to make it possible to further reduce noise mixing.

[Item 14] In the image capture device according to one of items 1 to 13, the signal line may be a control line through which the two or more pixels are driven, a power-supply line through which a voltage is supplied to the two or more pixels, or an output line through which signals are read from the two or more pixels.

[Item 15] In the image capture device according to one of items 1 to 14, the at least one electrode selected from the group consisting of the third electrode and the fourth electrode may cover all of the first impurity region when viewed along the normal direction.

In the present disclosure, all or a part of any of circuits, units, devices, parts, or portions or all or a pat of functional blocks in the block diagrams may be implemented as one or more of electronic circuits including, but not limited to, a semiconductor device, a semiconductor integrated circuit (IC), or a large-scale integration (LSI). The LSI or IC can be integrated into one chip or also can be a combination of a plurality of chips. For example, functional blocks other than a memory may be integrated into one chip. Although the name used here is an LSI or IC, it may also be called a system LSI, a very large-scale integration (VLSI), or an ultra large scale integration (ULSI) depending on the degree of integration. A field programmable gate array (FPGA) that can be programmed after manufacturing an LSI or a reconfigurable logic device that allows reconfiguration of connection relationships or setup of circuit cells inside the LSI can also be used for the same purpose.

In addition, the functions or operations of all or a part of the circuits, units, devices, parts, or portions can be implemented by executing software. In such a case, the software is recorded to one or more non-transitory recording media such as a ROM, an optical disk, or a hard disk drive, and when the software is executed by a processor, the software causes the processor together with peripheral devices to execute the functions specified in the software. A system or device may include such one or more non-transitory recording media on which the software is recorded and a processor together with necessary hardware devices such as an interface.

The embodiments of the present disclosure will be described below in detail. The embodiments described below each represent a general or specific example. Numerical values, shapes, materials, constituent elements, the arrangement and the connection forms of constituent elements, steps, the order of steps, and so on described in the embodiments below are examples and are not intended to limit the present disclosure. Various aspects described herein can be combined together, as long as such a combination does not cause contradiction. Also, of the constituent elements in the embodiments below, constituent elements not set forth in the independent claim that represents the broadest concept will be described as optional constituent elements. In the following description, constituent elements having substantially the same functions are denoted by the same reference numerals, and descriptions thereof may be omitted.

As described below with reference to the accompanying drawings, an image capture device according to a typical embodiment of the present disclosure has a plurality of pixels, each including a semiconductor substrate having a plurality of impurity regions and a photoelectric converter supported by the semiconductor substrate. An interlayer insulating layer having a connector therein is located between the semiconductor substrate and the photoelectric converter. The impurity regions in the semiconductor substrate are electrically connected to the photoelectric converter via the connector and include a first impurity region that functions as one of the source region and the drain region of a reset transistor and a second impurity region that functions as the other source region or drain region. The first impurity region constitutes at least a part of the charge accumulation region, and a signal, for example, a voltage signal, corresponding to the amount of charge accumulated in the charge accumulation region is read as an image signal.

Each of the pixels has, in the interlayer insulating layer interposed between the semiconductor substrate and the photoelectric converter, a capacitor including an electrode whose at least part overlaps the first impurity region and/or the second impurity region in plan view and a wiring layer that is located between the photoelectric converter and the capacitor and that includes a part of a signal line that extends to outside of a pixel region constituted by the pixels. The electrode of the capacitor functions as a light-shielding layer to thereby suppress or reduce false-signal generation due to light incidence on the first or second impurity region, thus providing an image in which the amount of noise is reduced. In particular, since the capacitor is arranged closer to the semiconductor substrate than the wiring layer including a part of the signal line that extends to outside of the pixel region, it is possible to more effectively suppress or reduce incidence of light on the first impurity region, the light being obliquely incident on the pixel.

First Embodiment

FIG. 1 illustrates an overview of an exemplary circuit configuration of an image capture device according to a first embodiment of the present disclosure. An image capture device 100 illustrated in FIG. 1 has a plurality of pixels 10 and peripheral circuits. The pixels 10 are arrayed, for example, two-dimensionally to thereby form a pixel region. FIG. 1 illustrates an example in which four pixels 10 are arranged in a matrix having 2 rows×2 columns. Needless to say, the number of pixels 10 and the arrangement thereof are not limited to this example. The array of pixels 10 may be one-dimensional. In this case, the image capture device 100 can be used as a line sensor.

Each of the pixels 10 is connected to a corresponding power-supply wire 22, and during operation, a predetermined power-supply voltage is supplied to each pixel 10 through the power-supply wire 22. An accumulation control line 17 is connected to each pixel 10. As will be described later in detail, each pixel 10 includes a photoelectric converter for photoelectrically converting incident light and a signal detection circuit for detecting a signal generated by the photoelectric converter. In a typical embodiment, the accumulation control line 17 applies a predetermined voltage to all the photoelectric converters in the pixels 10.

In the configuration illustrated in FIG. 1, the peripheral circuits in the image capture device 100 include a vertical scanning circuit 16, a plurality of load circuits 19, a plurality of column-signal processing circuits 20, a plurality of inverting amplifiers 24, and a horizontal signal reading circuit 21. The load circuits 19, the column-signal processing circuits 20, and the inverting amplifiers 24 are arranged for the respective columns of the two-dimensionally arrayed pixels 10. The vertical scanning circuit 16 is also called a row scanning circuit, and the column-signal processing circuits 20 is also called a row-signal accumulation circuit. The horizontal signal reading circuit 21 is also called a column scanning circuit.

Address signal lines 30 and reset signal lines 26 are connected to the vertical scanning circuit 16. The vertical scanning circuit 16 applies a predetermined voltage to each address signal line 30 to thereby select, for each row, the pixels 10 arranged in the corresponding row. As a result of selecting the pixels 10 for each row, signal voltages of the selected pixels 10 are read, and signal charge described below is reset.

In the illustrated example, feedback control lines 28 and sensitivity adjustment lines 32 are further connected to the vertical scanning circuit 16. In an example described below, the vertical scanning circuit 16 applies a predetermined voltage to the feedback control lines 28 to thereby form feedback loops for negatively feeding back outputs of the pixels 10. The vertical scanning circuit 16 can also supply a predetermined voltage to the pixels 10 via the sensitivity adjustment lines 32.

The image capture device 100 has vertical signal lines 18 provided for the respective columns of the pixels 10. The load circuits 19 are electrically connected to the vertical signal lines 18, respectively. The pixels 10 are electrically connected to the corresponding column-signal processing circuits 20 through the corresponding vertical signal lines 18. The column-signal processing circuits 20 perform noise suppression signal processing, analog-to-digital conversion, and so on typified by correlated double sampling. The horizontal signal reading circuit 21 is electrically connected to the column-signal processing circuits 20 provided so as to correspond to the respective columns of the pixels 10. The horizontal signal reading circuit 21 sequentially reads signals from the column-signal processing circuits 20 out to a horizontal common signal line 23.

In the configuration illustrated in FIG. 1, the inverting amplifiers 24 are provided so as to correspond to the respective columns of the pixels 10. A negative-side input terminal of each inverting amplifier 24 is connected to the corresponding vertical signal line 18, and a predetermined voltage Vref is supplied to a positive-side input terminal of each inverting amplifier 24. Vref is, for example, a positive voltage of 1 V or around 1 V. An output terminal of each inverting amplifier 24 is connected to the pixels 10 having connections with the negative-side input terminal of the inverting amplifier 24 through one of a plurality of feedback lines 25 provided so as to correspond to the columns of the pixels 10. Each inverting amplifier 24 constitutes a part of the feedback circuit for negatively feeding back outputs from the pixels 10. The inverting amplifiers 24 may be called feedback amplifiers. Details of the operation of the inverting amplifiers 24 are described later.

Figure 2:
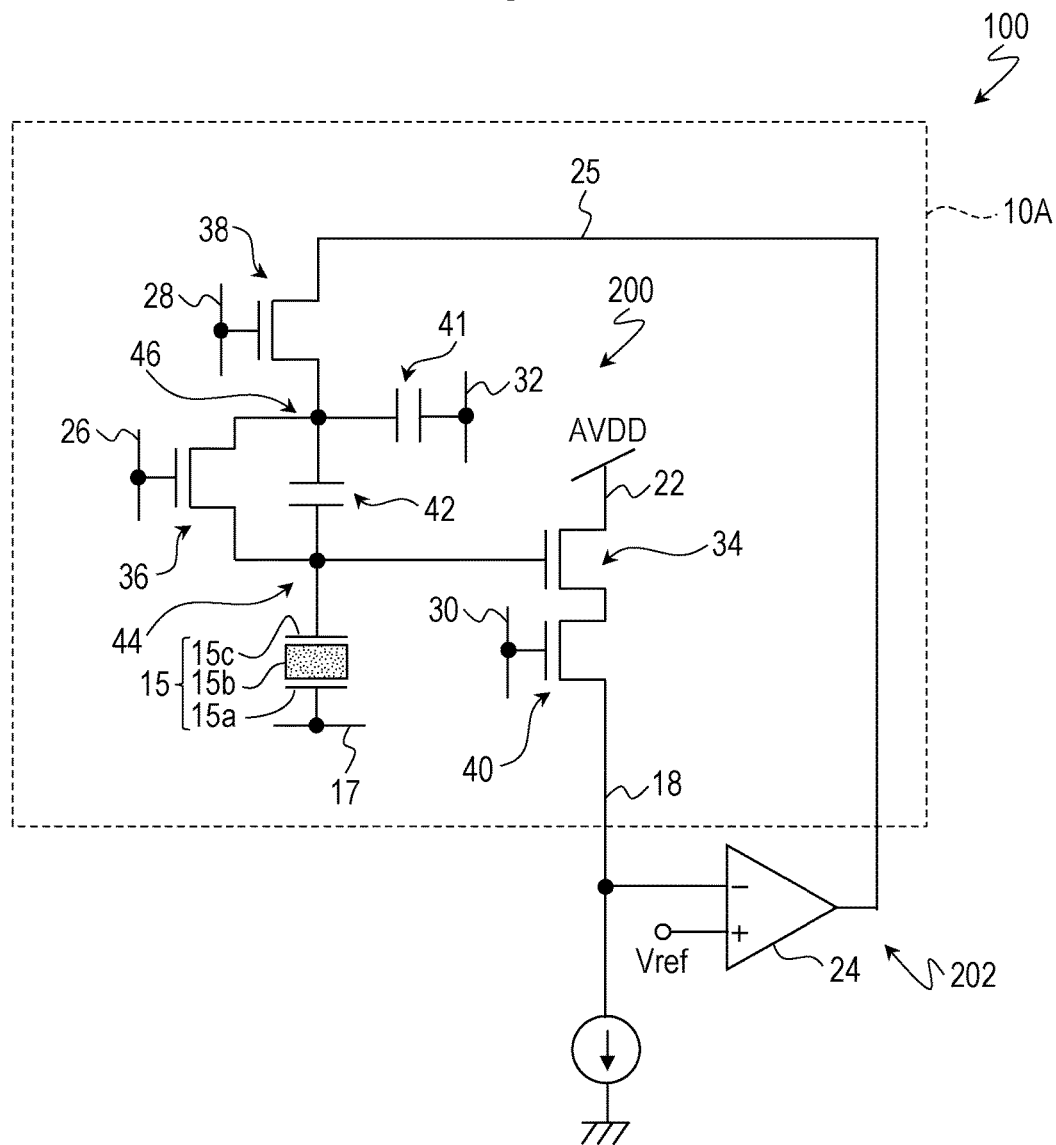
FIG. 2 is a diagram illustrating one example of the circuit configuration of one pixel.

FIG. 2 illustrates one example of the circuit configuration of one pixel 10. A pixel 10A illustrated in FIG. 2 includes a photoelectric converter 15 and a signal detection circuit 200. In the configuration illustrated in FIG. 2, the image capture device 100 includes a feedback circuit 202 for negatively feeding back an output of the signal detection circuit 200.

The photoelectric converter 15 has a first electrode 15a, a photoelectric conversion layer 15b, and a second electrode 15c, which serves as a pixel electrode. The first electrode 15a in the photoelectric converter 15 is connected to the accumulation control line 17, and the second electrode 15c in the photoelectric converter 15 is connected to a charge accumulation node 44. Controlling the potential of the first electrode 15a through the accumulation control line 17 allows the second electrode 15c to collect positive and negative charge generated by photoelectric conversion, typically, charge having one of the polarities of a hole and electron pair. For example, when holes are used as the signal charge, it is desirable that the potential of the first electrode 15a be made higher than the potential of the second electrode 15c. A case in which holes are used as the signal charge will be described below by way of example. For example, a voltage of about 10 V is applied to the first electrode 15a through the accumulation control line 17. As a result, signal charge is accumulated at the charge accumulation node 44. Electrons may also be used as the signal charge.

The signal detection circuit 200 includes a signal detection transistor 34 for amplifying a signal generated by the photoelectric converter 15 and outputting the amplified signal and a first capacitor 41. In the illustrated example, the signal detection circuit 200 further includes a reset transistor 36, a feedback transistor 38, a second capacitor 42 having a capacitance value smaller than that of the first capacitor 41, and an address transistor 40. The reset transistor 36 corresponds to a first transistor in the present disclosure, and the signal detection transistor 34 corresponds to a second transistor in the present disclosure. As described above, in the present embodiment, each pixel 10A has one or more capacitors therein. When the first capacitor 41 has a relatively large capacitance value, for example, kTC noise can be effectively reduced, as will be described later in detail. The following description will be given of an example in which N-channel metal-oxide-semiconductor field-effect transistors (MOSFETs) are used as transistors, such as the signal detection transistor 34.

The gate of the signal detection transistor 34 is connected to the charge accumulation node 44. In other words, the gate of the signal detection transistor 34 is connected to the second electrode 15c. The drain of the signal detection transistor 34 is connected to the power-supply wire 22, which serves as a source follower power supply, and the source of the signal detection transistor 34 is connected to the vertical signal line 18. The signal detection transistor 34 and the load circuit 19, which is not illustrated in FIG. 2, constitute a source follower circuit.

In this example, the address transistor 40 is connected between the source of the signal detection transistor 34 and the vertical signal line 18. The gate of the address transistor 40 is connected to the address signal line 30. When signal charge is accumulated at the charge accumulation node 44, a voltage corresponding to the amount of the accumulated signal charge is applied to the gate of the signal detection transistor 34. The signal detection transistor 34 amplifies the applied voltage. When the address transistor 40 is turned on, the voltage amplified by the signal detection transistor 34 is selectively read as a signal voltage.

In the configuration illustrated in FIG. 2, one of electrodes of the first capacitor 41 is connected to the sensitivity adjustment line 32. Typically, during operation of the image capture device 100, the potential of the sensitivity adjustment line 32 is fixed to a certain potential, for example, 0 V. The sensitivity adjustment line 32 can be used to control the potential of the charge accumulation node 44. The other electrode of the first capacitor 41 is connected to one of the electrodes of the second capacitor 42. A node including a connection point of the first capacitor 41 and the second capacitor 42 may hereinafter be referred to as a "reset drain node 46".

The other electrode of the second capacitor 42 is connected to the charge accumulation node 44. That is, of the electrodes of the second capacitor 42, the electrode that is not connected to the reset drain node 46 has electrical connection with the second electrode 15c in the photoelectric converter 15. In this example, the reset transistor 36 is connected in parallel with the second capacitor 42.

In the configuration illustrated in FIG. 2, the pixel 10A includes the feedback transistor 38. As illustrated in FIG. 2, one of the source and the drain of the feedback transistor 38 is connected to the reset drain node 46. The other source or drain of the feedback transistor 38 is connected to the corresponding feedback line 25. The gate of the feedback transistor 38 is connected to the above-described feedback control line 28.

(Device Structure of Pixels 10A)

Next, one example of the device structure of the pixels 10A will be described with reference to FIGS. 3 to 12.

Figure 3:
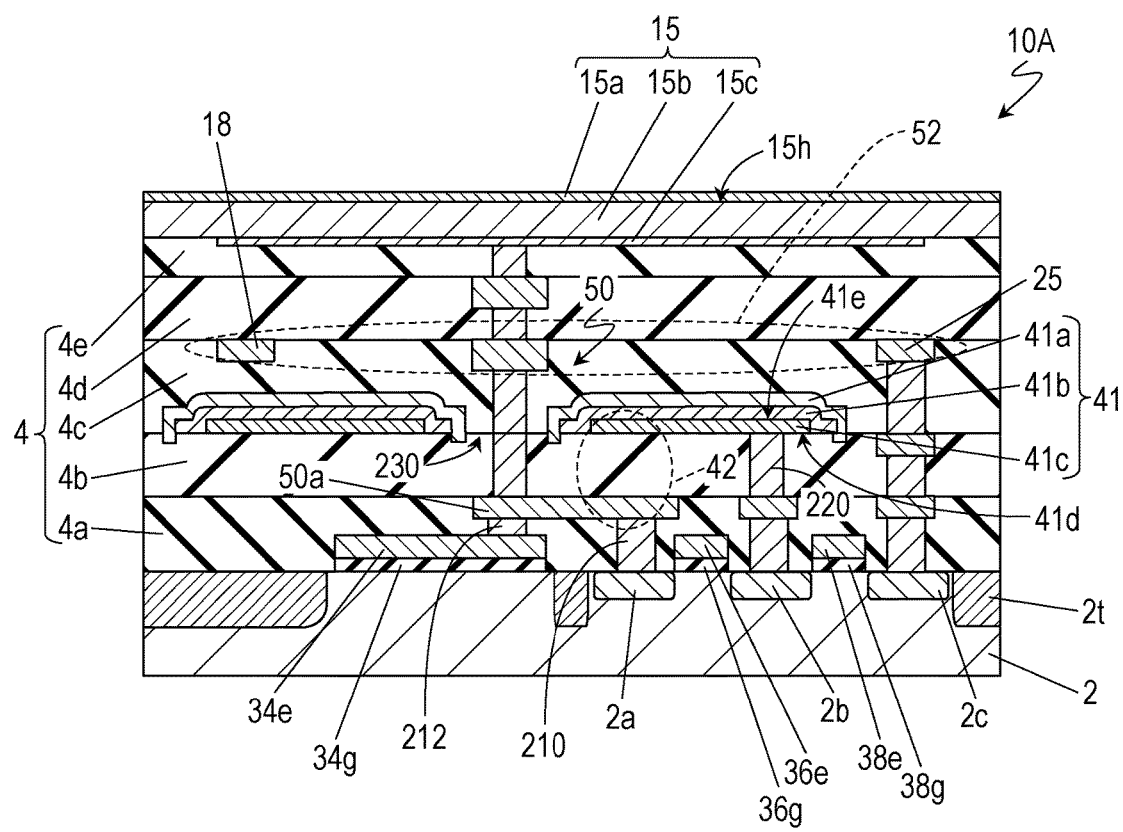
FIG. 3 is a one schematic sectional view of one of a plurality of pixels included in the image capture device.
Figure 4:
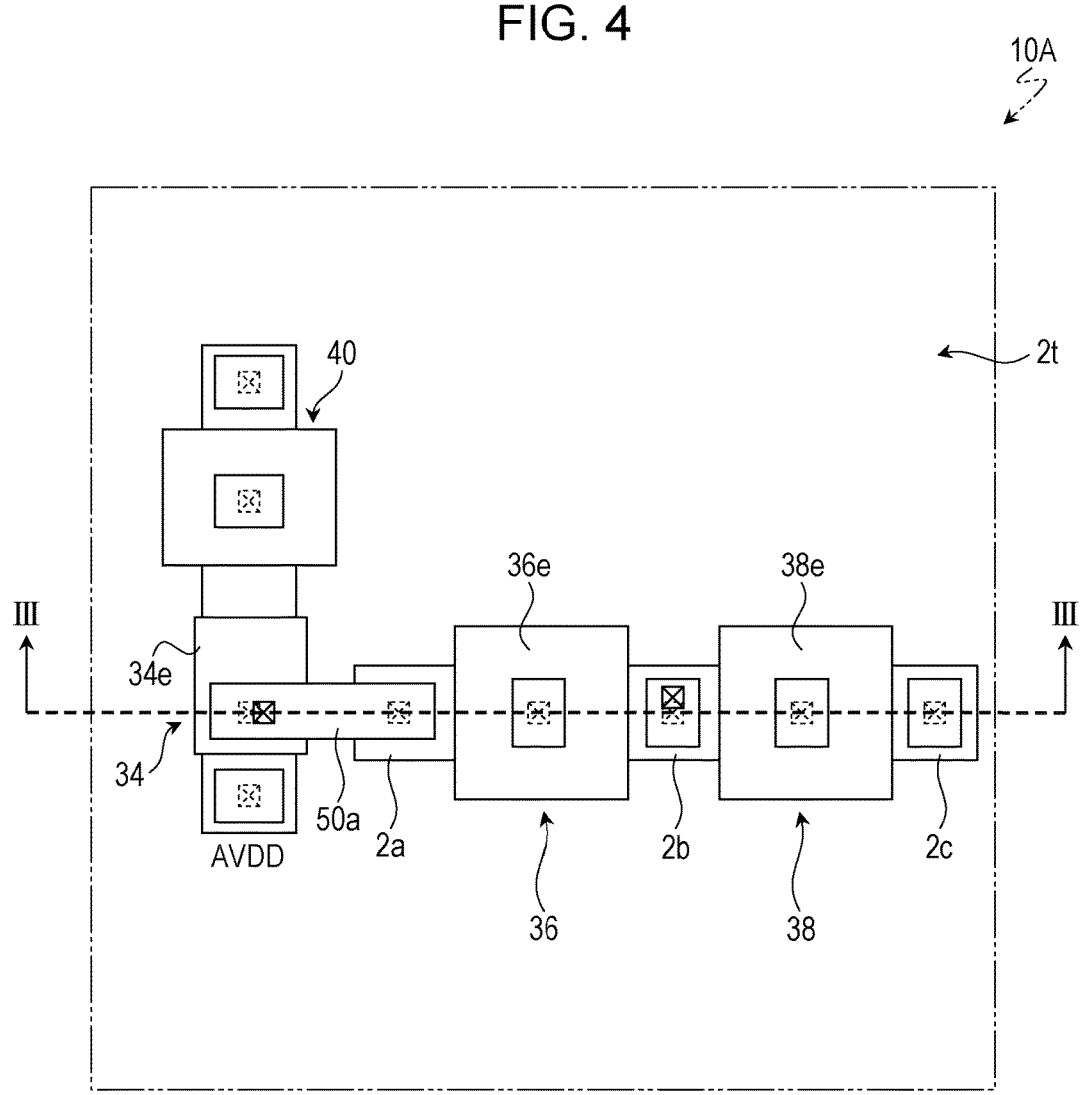
FIG. 4 is a schematic plan view illustrating one example of the layout of elements in one pixel.

FIG. 3 schematically illustrates a section of one of the pixels 10A included in the image capture device 100. FIG. 4 schematically illustrates one example of the layout of elements in the pixel 10A. FIG. 3 corresponds to a sectional view taken along line III-III illustrated in FIG. 4.

The image capture device 100 has a semiconductor substrate 2. For example, a silicon substrate may be used as the semiconductor substrate 2. The entire semiconductor substrate 2 does not necessarily have to a semiconductor substrate. The semiconductor substrate 2 may be, for example, an insulating substrate having a semiconductor layer on its surface. In this case, a p-type silicon substrate will be described as an example of the semiconductor substrate 2.

Each pixel 10A includes a part of the semiconductor substrate 2 and the photoelectric converter 15. An element isolation region 2t formed in the semiconductor substrate 2 electrically isolates each pixel 10A from the other pixels 10A. As illustrated in FIG. 3, typically, an interlayer insulating layer 4 that covers the semiconductor substrate 2 is arranged between the semiconductor substrate 2 and the photoelectric converter 15. In this example, the interlayer insulating layer 4 has a structure in which insulating layers 4a, 4b, 4c, 4d, and 4e are laminated. Each of the insulating layers 4a, 4b, 4c, 4d, and 4e is formed of, for example, silicon dioxide. In this example, the photoelectric converter 15 is located on the insulating layer 4e that is located farthest from the semiconductor substrate 2.

Impurity regions 2a, 2b, and 2c are formed in the semiconductor substrate 2. Each of the impurity regions 2a, 2b, and 2c is typically an N-type diffusion region. A gate insulating layer 36g and a gate electrode 36e of the reset transistor 36 are provided in a region located on the semiconductor substrate 2 and between the impurity regions 2a and 2b. Also, a gate insulating layer 38g and a gate electrode 38e of the feedback transistor 38 are provided in a region located on the semiconductor substrate 2 and between the impurity regions 2b and 2c. The impurity region 2a functions as one of the drain region and the source region of the reset transistor 36, and the impurity region 2b functions as the other drain region or source region of the reset transistor 36. In this example, the reset transistor 36 and the feedback transistor 38 share the impurity region 2b and thus are electrically connected to each other. The impurity region 2a corresponds to a first impurity region in the present disclosure, and the impurity region 2b corresponds to a second impurity region in the present disclosure.

The impurity region 2c in the semiconductor substrate 2 functions as one of the drain region and the source region of the feedback transistor 38. The impurity region 2c is connected to the feedback line 25, which extends through two or more of the pixels 10A, via a plug arranged in the interlayer insulating layer 4. As will be described later in detail with reference to the accompanying drawings, the feedback line 25 is a signal line that extends to outside of the pixel region.

In the configuration illustrated in FIG. 3, of the feedback line 25, a portion located inside the pixel 10A is a part of a wiring layer 52 located between the second electrode 15c in the photoelectric converter 15 and the semiconductor substrate 2. In this example, the wiring layer 52 also includes a portion that is included in the vertical signal line 18 and that is located in the pixel 10A of interest. That is, in this example, in the pixel 10A, the vertical signal line 18 also belongs to the same layer as that of the feedback line 25. The vertical signal line 18 is also a signal line that extends to outside of the pixel region, similarly to the feedback line 25.

Figure 5:
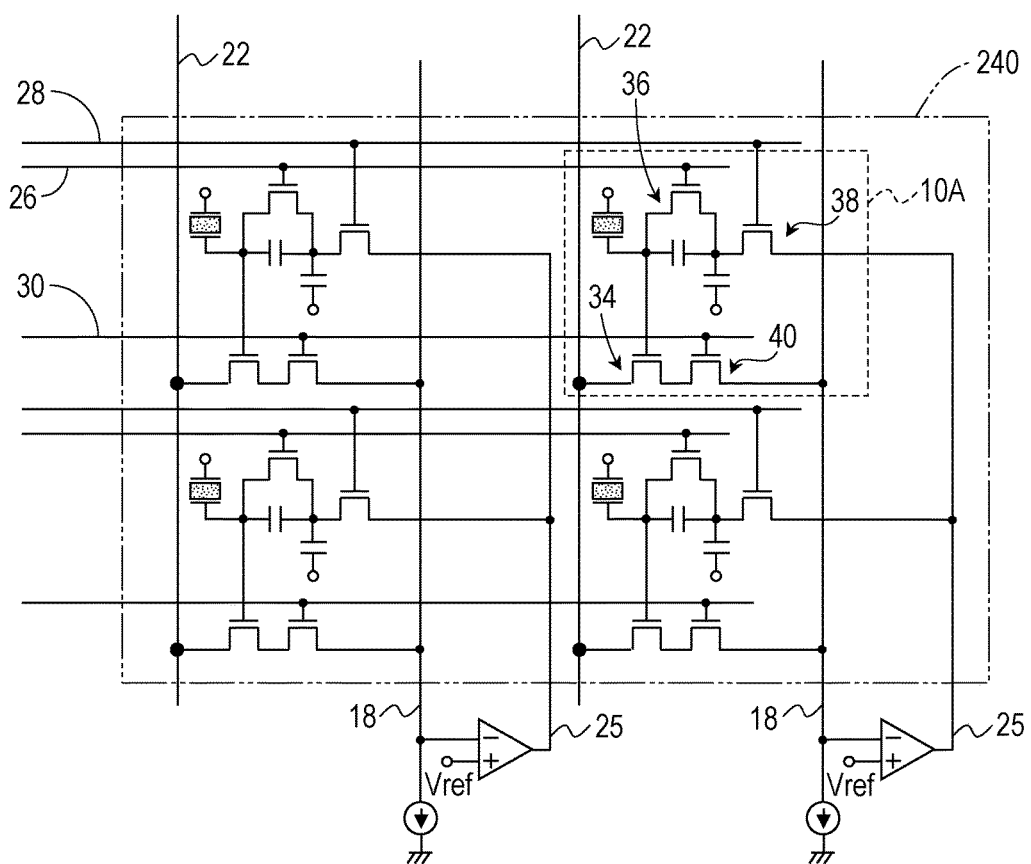
FIG. 5 is a diagram illustrating relationships between the pixels and various signal lines connected to the pixels.

FIG. 5 illustrates relationships between the pixels 10A and various signal lines connected to the pixels 10A. As described above, the plurality of pixels 10A form a pixel region 240. Although four pixels 10A of the plurality of pixels 10A are illustrated in FIG. 5 for simplicity of description, in practice, for example, three-hundred thousand pixels 10A may be arranged in a matrix in the pixel region 240 for the VGA standard, and about 36 million pixels 10A may be arranged for 8K. Herein, the pixel region 240 can be defined as a region having a repeated structure of a plurality of units each having the signal detection transistor 34. The above-described peripheral circuits are arranged in peripheral regions outside the pixel region 240.

As illustrated in FIG. 5, the power-supply lines 22, the feedback lines 25, and the vertical signal lines 18 extend in up-and-down directions in FIG. 5, that is, in a column direction of the pixels 10A. Each of the feedback lines 25 and each of the vertical signal lines 18, the feedback lines 25 and the vertical signal lines 18 being provided for the corresponding columns of the pixel 10A, have connections with each of the two pixels 10A that are arranged along the column direction. The reset signal lines 26, the feedback control lines 28, and the address signal lines 30 typically extend in a row direction of the pixels 10A. These signal lines are connected to each of the two pixels 10A that are arranged along the row direction. Similarly, the sensitivity adjustment lines 32 also extend in the column direction or the row direction of the pixels 10A, each sensitivity adjustment line 32 is connected to each of the two pixels 10A arranged along the column direction or to each of the two pixels 10A arranged along the row direction.

Each of the vertical signal lines 18, the power-supply lines 22, the feedback lines 25, the reset signal lines 26, the feedback control lines 28, the address signal lines 30, and the sensitivity adjustment lines 32 is a signal line provided so as to cross the plurality of pixels 10A. The above-described wiring layer 52 includes at least one part of these signal lines. The wiring layer 52 may include a part of the feedback control lines 28, each being a control line for driving two or more pixels, or a part of the address signal lines 30, instead of a part of the feedback lines 25 or a part of the vertical signal lines 18, each being an output line for reading signals from two or more pixels. Each of the feedback control lines 28, the feedback lines 25, the reset signal lines 26, the address signal lines 30, and the sensitivity adjustment lines 32 corresponds to a control line in the present disclosure. Each power-supply wire 22 corresponds to a power-supply line in the present disclosure. The vertical signal line 18 corresponds to an output line in the present disclosure.

A reference is made to FIG. 3 again. A gate insulating layer 34g and a gate electrode 34e of the signal detection transistor 34 are further provided on a major surface of the semiconductor substrate 2. As can be understood from FIG. 4, the drain region and the source region of the signal detection transistor 34 are located at the front side and the back side, respectively, of the plane of FIG. 3. In this example, a pair of the reset transistor 36 and the feedback transistor 38 and a pair of the signal detection transistor 34 and the address transistor 40 are isolated by the element isolation region 2t. The element isolation region 2t can be formed, for example, by acceptor ion-implantation under a predetermined implantation condition.

Each pixel 10A has, in the interlayer insulating layer 4, a connector 50 that electrically connects the impurity region 2a in the semiconductor substrate 2 to the second electrode 15c in the photoelectric converter 15. The impurity region 2a functions as at least a part of a charge accumulation region in which signal charge generated by the photoelectric converter 15 is accumulated.

The connector 50 partly includes a polysilicon plug 210 having one end connected to the impurity region 2a in the semiconductor substrate 2, a polysilicon plug 212 having one end connected to the gate electrode 34e of the signal detection transistor 34, and a wire 50a that inter-connects the polysilicon plugs 210 and 212. The connector 50 electrically inter-connects the impurity region 2a and the gate electrode 34e. That is, the impurity region 2a that functions as the drain region or the source region of the reset transistor 36 and the gate electrode 34e of the signal detection transistor 34 are electrically connected to the second electrode 15c in the photoelectric converter 15 via the connector 50. The wire 50a may be a part of a polysilicon layer given conductivity by impurity doping.

Of the connector 50, a portion that is located between the wire 50a and the second electrode 15c is typically formed of metal, such as copper. Accordingly, the wiring layer 52 may be a layer including wires formed of metal, such as copper. The number of wiring layers arranged in the interlayer insulating layer 4 and the number of insulating layers arranged in the interlayer insulating layer 4 are not limited to the numbers of layers illustrated in FIG. 3 and may be set arbitrarily.

The photoelectric converter 15 supported by the semiconductor substrate 2 includes the first electrode 15a, the photoelectric conversion layer 15b, and the second electrode 15c. The photoelectric converter 15 typically has a structure in which the photoelectric conversion layer 15b is sandwiched between the first electrode 15a and the second electrode 15c.

The first electrode 15a in the photoelectric converter 15 is provided at a side at which light from a subject arrives, in other words, adjacent to a light-receiving surface 15h of the photoelectric conversion layer 15b. The first electrode 15a is formed of transparent conductive material, such as indium tin oxide (ITO). The first electrode 15a may be directly formed on the photoelectric conversion layer 15b, or another layer may be arranged between the first electrode 15a and the photoelectric conversion layer 15b.

The photoelectric conversion layer 15b is formed of an organic material or an inorganic material, such as or amorphous silicon. The photoelectric conversion layer 15b may include a layer constituted by an organic material and a layer constituted by an inorganic material.

The second electrode 15c is located closer to the semiconductor substrate 2 than the first electrode 15a and the photoelectric conversion layer 15b and is spatially isolated from the second electrodes 15c in the adjacent pixels 10A, so that the second electrode 15 is electrically isolated therefrom. The second electrode 15c collects charge generated by photoelectric conversion in the photoelectric conversion layer 15b. The second electrode 15c may be formed of metal, such as aluminum or copper, metal nitride, or polysilicon or the like given conductivity by impurity doping.

The first electrode 15a and the photoelectric conversion layer 15b are typically formed through two or more of the pixels 10A. However, similarly to the second electrode 15c, at least one of the first electrode 15a and the photoelectric conversion layer 15b may be spatially isolated from the first electrodes 15a or the photoelectric conversion layers 15b in the other pixels 10A.

In the present embodiment, the first capacitor 41 is located between a wiring layer including at least a part of a signal line connected to two or more pixels, the wiring layer being included in the wiring layers arranged in the interlayer insulating layer 4, and the semiconductor substrate 2. In the configuration illustrated in FIG. 3, the first capacitor 41 is located between the wiring layer 52, which includes a part of the vertical signal line 18 and a part of the feedback line 25, and the semiconductor substrate 2. In other words, in the present embodiment, the first capacitor 41 is located closer to the semiconductor substrate 2 than the wiring layer including a part of the corresponding signal line connected to two or more pixels.

The first capacitor 41 has an upper electrode 41a, a lower electrode 41c, and a dielectric layer 41b arranged between the upper electrode 41a and the lower electrode 41c. In this example, in a sectional view, the upper electrode 41a is located between the wiring layer 52 and the semiconductor substrate 2, and the lower electrode 41c is located between the upper electrode 41a and the semiconductor substrate 2. The terms "upper" and "lower" herein are used to indicate a relative arrangement of members and are not intended to limit the orientation of the image capture device in the present disclosure. The same applies to the terms "above"

and "below" herein. The upper electrode 41a corresponds to a third electrode in the present disclosure, and the lower electrode 41c corresponds to a fourth electrode in the present disclosure.

The upper electrode 41a and/or the lower electrode 41c in the first capacitor 41 may be a part of a wiring layer located between the second electrode 15c in the photoelectric converter 15 and the gate electrode 34e of the signal detection transistor 34. The sensitivity adjustment line 32, not illustrated in FIG. 3, is connected to the upper electrode 41a. In this case, the lower electrode 41c extends in a plane orthogonal to the normal direction of the semiconductor substrate 2 and is connected to the impurity region 2b through a via, a plug, or the like in the interlayer insulating layer 4.

In the configuration illustrated in FIG. 3, at least a part of the upper electrode 41a in the first capacitor 41 is located above the impurity region 2a. As described above, in the present embodiment, for example, when viewed along the normal direction of the semiconductor substrate 2, the upper electrode 41a has a shape that covers a part or all of the impurity region 2a that constitutes at least a part of the charge accumulation region. The upper electrode 41a and the lower electrode 41c may be, for example, metal electrodes or metal nitride electrodes. That is, the first capacitor 41 may have a metal-insulator-metal (MIM) structure in which a dielectric body is sandwiched between two electrodes formed of metal or a metal compound. For example, when the MIM structure is employed, it is possible to cause the upper electrode 41a and/or the lower electrode 41c to function as a light-shielding layer, thus making it possible to suppress or reduce light of incidence on the impurity region 2a, the light having been incident on the pixel 10A.

As described above, in each pixel 10A, the second electrode 15c collects signal charge generated by light that is incident on the photoelectric conversion layer 15b via the first electrode 15a in the photoelectric converter 15, and the collected signal charge is accumulated in the charge accumulation region. However, part of radiated light can pass through the photoelectric conversion layer 15b without being absorbed by the photoelectric conversion layer 15b. As described above, a gap may exist between two second electrodes 15c that are adjacent to each other. Thus, light that is incident on the photoelectric converter 15 and passes through the gap between the second electrodes 15c may repeat diffused reflection between the photoelectric converter 15 and the semiconductor substrate 2 to reach, for example, the impurity region 2a. Herein, light that passes through the photoelectric converter 15 and reaches the impurity region in the semiconductor substrate 2 may be referred to as "stray light", for convenience of description.

When such light is incident on the impurity region 2a, charge is generated in the impurity region 2a by photoelectric conversion. As described above with reference to FIG. 3, the gate electrode 34e of the signal detection transistor 34 is connected to the impurity region 2a via the connector 50, and the signal detection transistor 34 amplifies a signal corresponding to the amount of charge accumulated in the impurity region 2a and outputs the amplified signal. Thus, excess charge generated in the impurity region 2a owing to the stray light is a cause of generating a false signal. In other words, light incidence on the impurity region 2a adds noise to an original signal, thus reducing the image quality.

Figure 6:
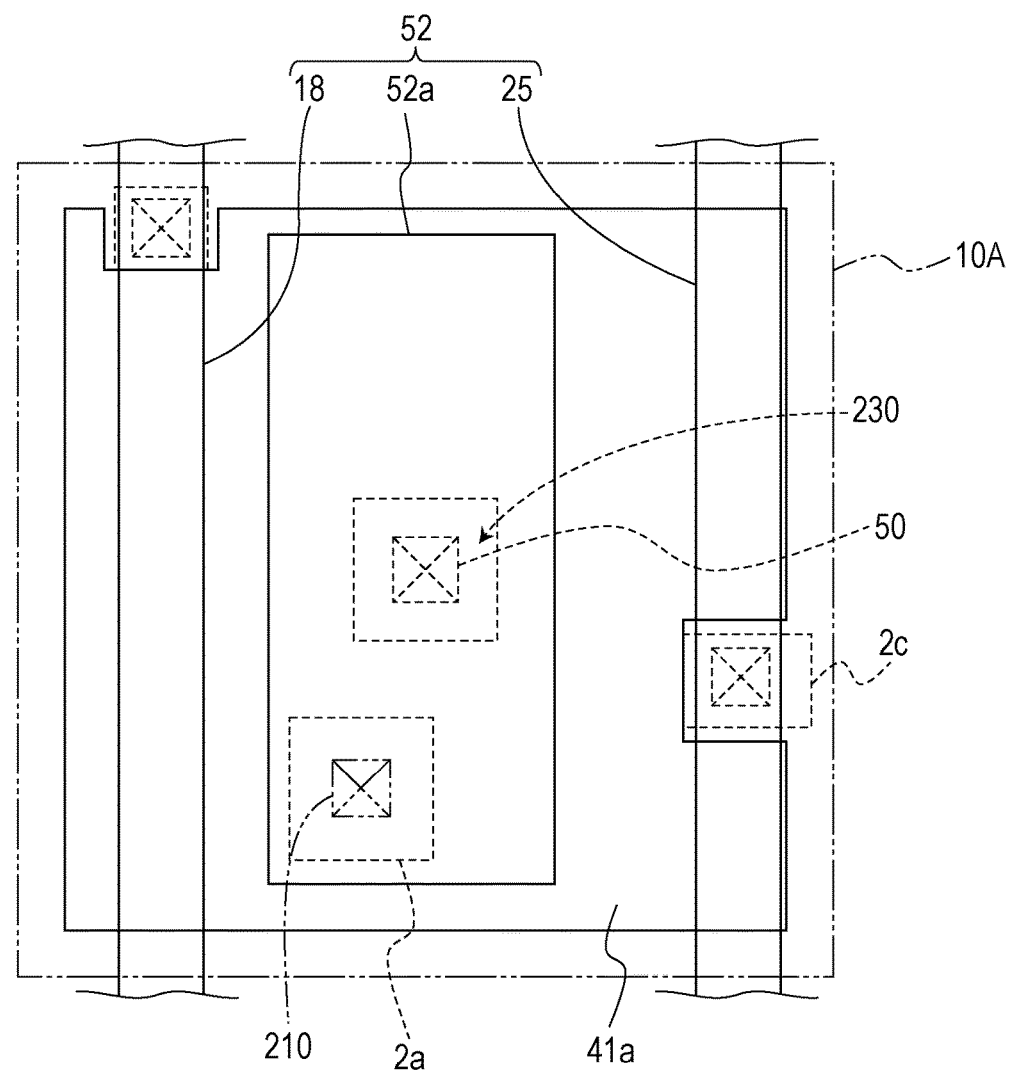
FIG. 6 is a plan view illustrating an arrangement relationship of a wiring layer, an upper electrode, and an impurity region, when a photoelectric converter is removed from the pixel, and the resulting structure is viewed from the normal direction of a semiconductor substrate.

FIG. 6 illustrates an example of an arrangement relationship of the wiring layer 52, the upper electrode 41a, and the impurity region 2a, when the photoelectric converter 15 is removed from the pixel 10A, and the resulting structure is viewed from the normal direction of the semiconductor substrate 2. In the configuration illustrated in FIG. 6, the wiring layer 52 includes a part of the vertical signal line 18 that extends in the column direction, a part of the feedback line 25 that extends in the column direction, and a wire 52a connected to the connector 50. The wire 52a is a portion of the wiring layer 52 which is located in the same layer as the vertical signal line 18 and the feedback line 25 and constitutes a part of the connector 50.

In this example, the impurity region 2a that constitutes a part of the charge accumulation region is located at a position that overlaps the wire 52a in plan view. In particular, in this example, all of the impurity region 2a is covered by the wire 52a. The shape of the wire 52a, the shape of the part of the vertical signal line 18, and the shape of the part of the feedback line 25, the shapes being illustrated in FIG. 6, are merely exemplary and illustrative. A part of the vertical signal line 18 or a part of the feedback line 25 may have a shape that covers all of the impurity region 2a. In this manner, the wiring layer 52 may cover all of the impurity region 2a.

As illustrated in FIG. 6, according to the present embodiment, since at least a part of the upper electrode 41a in the first capacitor 41 overlaps the impurity region 2a in plan view, the upper electrode 41a can be used as a light-shielding electrode to thereby make it possible to suppress or reduce light incidence on the impurity region 2a. Since light incidence on the impurity region 2a is suppressed or reduced, it is possible to prevent generation of a false signal. Suppression or reduction of stray light contributes to an improvement of the reliability of the image capture device 100.

In the example illustrated in FIG. 3, at least a part of the lower electrode 41c is also located above the impurity region 2a. That is, the lower electrode 41c may also have a shape that covers all of the impurity region 2a when viewed along the normal direction of the semiconductor substrate 2. When the lower electrode 41c has a shape that covers a part or all of the impurity region 2a in plan view, it is possible to cause the lower electrode 41c to serve as a light-shielding layer to thereby make it possible to suppress or reduce light incidence on the impurity region 2a. In this example, both at least a part of the upper electrode 41a and at least a part of the lower electrode 41c cover the impurity region 2a in plan view. However, it is not essential that both the upper electrode 41a and the lower electrode 41c cover the impurity region 2a in plan view. As long as at least one of the upper electrode 41a and the lower electrode 41c has a shape that covers the impurity region 2a when viewed along the normal direction of the semiconductor substrate 2, it can be expected that generation of a false signal is prevented.

Also, in the example illustrated in FIG. 3, the first capacitor 41 is arranged between the wiring layer 52 including a part of the vertical signal line 18 and the semiconductor substrate 2. In other words, in this example, the first capacitor 41 is located closer to the semiconductor substrate 2 than the wiring layer including a part of the signal line arranged across two or more pixels. Thus, the effect of light shielding at a position closer to the semiconductor substrate 2 is obtained, and a high light shielding effect can also be obtained for stray light that travels obliquely to the normal direction of the semiconductor substrate 2. Accordingly, it is possible to more effectively prevent an image quality reduction due to parasitic light sensitivity due to stray light.

Examples of material for forming the upper electrode 41a include titanium (Ti), titanium nitride (TiN), tantalum (Ta), tantalum nitride (TaN), and molybdenum (Mo). When a similar material is used to form the lower electrode 41c whose at least part has a shape that overlaps the impurity region 2a in plan view, the lower electrode 41c may also be used as a light shielding electrode. The upper electrode 41a and the lower electrode 41c may have a thickness in a range that is larger than or equal to about 10 nm and that is smaller than or equal to about 100 nm. The range of the thickness of the upper electrode 41a and the lower electrode 41c may be a range that is larger than or equal to about 30 nm and that is smaller than or equal to about 100 nm. The thickness of the upper electrode 41a and the lower electrode 41c may be appropriately set according to the material that constitutes the upper and lower electrodes 41a and 41c. For example, forming a TaN electrode with a thickness of about 100 nm as the upper electrode 41a makes it possible to realize a sufficient light-shielding effect in the upper electrode 41a. The same applies to the lower electrode 41c.

In addition, in the configuration illustrated in FIG. 3, the upper electrode 41a has a shape that also covers the impurity region 2b when viewed along the normal direction of the semiconductor substrate 2. According to such a configuration, it is possible to suppress or reduce incidence of light on the impurity regions 2b, the light having been incident on the photoelectric converters 15 and having passed through the gaps between the second electrodes 15c. That is, charge generation due to photoelectric conversion can be suppressed or reduced in the impurity regions 2b.

Since each impurity region 2b constitutes a part of the reset drain node 46, the potential at the reset drain node 46 varies when charge is generated in the impurity region 2b by photoelectric conversion. As can be understood from FIG. 2, the charge accumulation node 44 is electrically coupled to the reset drain node 46 via the second capacitor 42. Thus, when the potential at the reset drain node 46 varies owing to generation of charge, the potential at the charge accumulation node 44 can vary in response to a variation in the potential at the reset drain node 46. That is, there is a possibility that noise is introduced owing to light incidence on the impurity region 2b.

When the upper electrode 41a is shaped so as to cover the impurity region 2b in plan view, as illustrated in FIG. 3, it is possible to suppress or reduce noise mixing due to light incidence on the impurity region 2b. When the lower electrode 41c, instead of the upper electrode 41a, is shaped so as to cover the impurity region 2b in plan view, a similar advantage is obtained. Alternatively, both the upper electrode 41a and the lower electrode 41c may be shaped so as to cover the impurity region 2b in plan view, as illustrated in FIG. 3. FIG. 3 illustrates a structure in which the upper electrode 41a has an area that is larger than the area of the lower electrode 41c when viewed from the normal direction of the semiconductor substrate 2. However, it is not essential that the area of the upper electrode 41a when viewed from the normal direction of the semiconductor substrate 2 be larger than the area of the lower electrode 41c. The area of the upper electrode 41a may be smaller than the area of the lower electrode 41c.

In the configuration illustrated in FIG. 3, a via 220 electrically connected to the impurity region 2b is connected to a lower surface 41d of the lower electrode 41c. The dielectric layer 41b covers the surface that is included in the surfaces of the lower electrode 41c and that is not the lower surface 41d. The upper electrode 41a covers an upper surface 41e of the lower electrode 41c and a side surface that connects the upper surface 41e and the lower surface 41d.

During operation of the image capture device 100, a predetermined voltage is supplied to the upper electrode 41a through the sensitivity adjustment line 32, which is not illustrated in FIG. 3. Typically, as a result of the supply of the predetermined voltage, the potential at the upper electrode 41a is fixed to a certain value. When the potential at the upper electrode 41a is, for example, fixed to a certain value, it is possible to cause the upper electrode 41a to function as a shield electrode, and it is possible to obtain an effect of reducing noise mixing due to electrical coupling with the lower electrode 41c. Adjusting the voltage supplied to the upper electrode 41a through the sensitivity adjustment line 32 also makes it possible to adjust the sensitivity of the image capture device 100.

In this example, a contact for electrical connection with the impurity region 2b is provided at the lower surface 41d side of the lower electrode 41c, and a portion above the lower electrode 41c is covered with the upper electrode 41a to make it possible to suppress or reduce electrical coupling between the lower electrode 41c and another electrode and/or a wire. For example, as illustrated in FIG. 3, a wiring layer, such as the wiring layer 52, may be arranged between the upper electrode 41a and the photoelectric converter 15. As illustrated in FIG. 3, when the portion above the lower electrode 41c is covered by the upper electrode 41a, and the upper electrode 41a is interposed to thereby make it possible to suppress or reduce electrical coupling between the lower electrode 41c and the wiring layer, for example, the wiring layer 52, above the upper electrode 41a.

In addition, in this example, since not only the upper surface 41e of the lower electrode 41c but also the side surface that connects the upper surface 41e and the lower surface 41d is covered by the upper electrode 41a, an electrostatic shielding effect on the lower electrode 41c improves, thus making it possible to more effectively suppress or reduce electrical coupling between the lower electrode 41c and another electrode and/or a wire. Since the via 220 is connected to the lower surface 41d of the lower electrode 41c, complication of wires is also avoided.

The terms "upper surface" and "lower surface" herein are used to distinguish a major surface of a layer-shaped or plate-shaped member in the pixels and are not used to intend to limit the orientation of the image capture device in the present disclosure. Herein, the "upper surface" means, of two major surfaces of a layer of interest, a major surface that is closer to the photoelectric converter 15 than to the semiconductor substrate 2. The "lower surface" means, of two major surfaces of a layer of interest, a major surface that is closer to the semiconductor substrate 2 than to the photoelectric converter 15, that is, a major surface that is opposite to the "upper surface".

Arranging the first capacitor 41 in the interlayer insulating layer 4 makes it possible to avoid physical interference with the gate electrode of a transistor, such as the reset transistor 36. Accordingly, compared with a case in which the first capacitor 41 is arranged on the major surface of the semiconductor substrate 2, the freedom of design of the electrode shapes of the upper electrode 41a and the lower electrode 41c improves, thus making it easier to obtain a larger electrode area. In addition, the range of choices in material in the upper electrode 41a, the dielectric layer 41b, and the lower electrode 41c increases, thus facilitating that the first capacitor 41 having a larger capacitance value is formed in the pixel. Increasing the capacitance value of the first capacitor 41, as described below, makes it possible to obtain a higher noise reduction effect in noise canceling utilizing negative feedback.

Meanwhile, with regard to the second capacitor 42, in terms of obtaining a higher noise reduction effect in noise canceling utilizing negative feedback, a smaller capacitance value is advantageous. In the configuration illustrated in FIG. 3, the second capacitor 42 is constituted by a part of the lower electrode 41c, a part of the wire 50a, and a portion included in an insulating layer 4b and interposed between these parts. The wire 50a in the connector 50 has, for example, a portion that extends in a plane orthogonal to the normal direction of the semiconductor substrate 2 and that opposes the lower electrode 41c in the first capacitor 41. According to such shapes and arrangement of the electrodes and the wires, a capacitance can be formed between a part of the lower electrode 41c and a part of the wire 50a and can be used as the second capacitor 42.

As described above, when the design in which the first capacitor 41 is located in the interlayer insulating layer 4 is employed, the range of choices in material in the dielectric layer 41b increases. For example, the dielectric layer 41b may be formed using material that is different from material that constitutes the interlayer insulating layer 4. For example, the dielectric layer 41b may be formed of metal oxide or metal nitride. The material for forming the dielectric layer 41b is, for example, oxide or nitride containing one or more kinds selected from a group consisting of Zr, Al, La, Ba, Ta, Ti, Bi, Sr, Si, Y, and Hf. The material for forming the dielectric layer 41b may be a binary compound, a ternary compound, or a tetranary compound.

For example, atomic layer deposition (ALD) may be used to form the dielectric layer 41b. According to ALD, atoms that are different from each other can be deposited a few atoms at a time. Specifically, material compound molecules, which act as precursors, are incorporated into a vacuum vessel in which a substrate is placed. The incorporated precursors are adsorbed on the surfaces of the substrate in the vacuum vessel. Thereafter, a chemical reaction leaves only desired atoms in the precursors to thereby form a film corresponding to one layer of atoms.

In this case, an Hf oxide film is used as the dielectric layer 41b of the first capacitor 41. In formation of the Hf oxide film, tetrakis(ethylmethylamido)hafnium is used as precursors, and after the precursors are incorporated, plasma is discharged. The discharge of plasma is performed in an oxygen atmosphere to thereby promote oxidation of Hf. The above-described process is repeated to thereby deposit $HfO_2$ layer by layer. For example, incorporating gaseous precursors and discharging plasma are repeated 250 times to thereby form a film with a thickness of 22 nm as the dielectric layer 41b. The dielectric layer 41b may also include two or more films formed of materials different from each other. When the dielectric layer 41b is formed as a laminated film of two or more layers, a dielectric layer that takes advantage of materials constituting the respective layers is obtained.

In the configuration illustrated in FIG. 3, the first capacitor 41 has, for example, an opening 230 at its center. That is, in this example, openings are provided in the upper electrode 41a, the dielectric layer 41b, and the lower electrode 41c. For example, with respect to the dielectric layer 41b, photolithography employed in general semiconductor processes is used to leave, for example, an Hf oxide film in a desired region to thereby make it possible to form the dielectric layer 41b having an opening.

When the dielectric layer 41b is exposed to plasma or radicals used for ashing, the dielectric layer 41b may be damaged in a process for removing a resist. The dielectric layer 41b may also be exposed to a resist stripping solution for removing a resist residue. When the dielectric layer 41b is damaged, leakage current between the upper electrode 41a and the lower electrode 41c may increase. In the configuration illustrated in FIG. 3, electrical coupling occurs between the lower electrode 41c in the first capacitor 41 and the wire 50a in the connector 50, and thus when leakage current is generated between the upper electrode 41a and the lower electrode 41c in the first capacitor 41, there is a possibility that noise due to the leakage current is mixed into an output signal.

For example, when a protective layer is provided on an upper surface of the dielectric layer 41b, it is possible to suppress or reduce damaging of the dielectric layer 41b owing to removal of the resist. Material having a relatively high electrical conductivity may be selected as material for forming the protective layer. Examples of the material include metal, such as Cu or Al, and polysilicon. When material having a relatively high electrical conductivity is used as the material of the protective layer, it is possible to avoid a reduction in the capacitance value of the first capacitor 41, the reduction being caused by interposing the protective layer between the upper electrode 41a and the lower electrode 41c.

As described above, the connector 50 has a structure in which it connects the impurity region 2a in the semiconductor substrate 2 to the second electrode 15c in the photoelectric converter 15. In this case, the connector 50 penetrates the first capacitor 41, provided in the interlayer insulating layer 4, at the position of the opening 230 in the first capacitor 41 to electrically inter-connect the impurity region 2a and the second electrode 15c.

(Advantages of Providing Opening 230 in First Capacitor 41)

Figure 7:
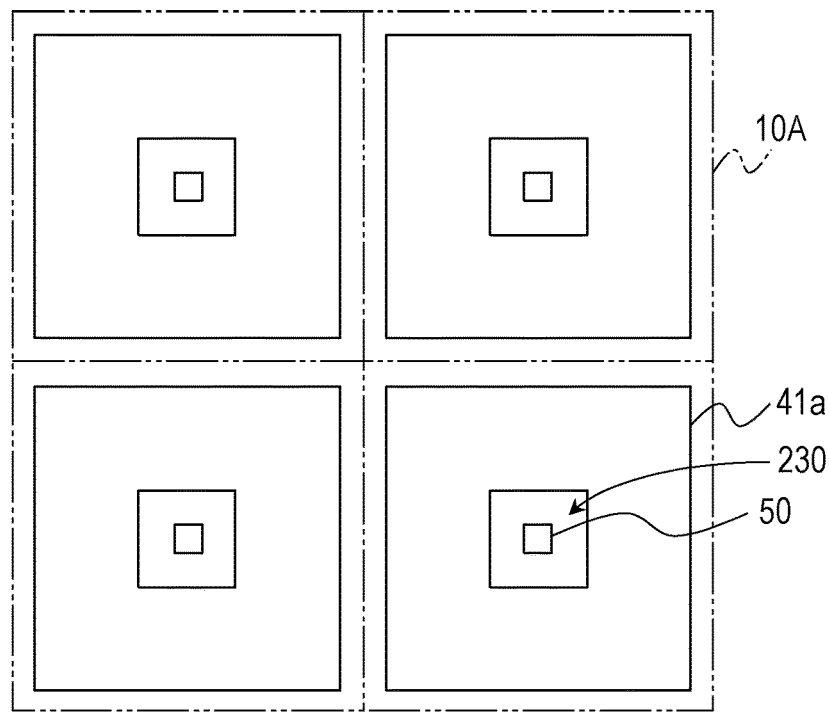
FIG. 7 is a plan view schematically illustrating one example of arrangement of a connector relative to a first capacitor.

FIG. 7 illustrates one example of arrangement of the connector 50 relative to the corresponding first capacitor 41. In the configuration illustrated in FIG. 7, the first capacitor 41 in each pixel 10A surrounds the connector 50. In this example, the outer shapes of both the upper electrode 41a and the opening 230 when viewed from the normal direction of the semiconductor substrate 2 are rectangular. Needless to say, the outer shapes of the upper electrode 41a and the opening 230 in plan view are not limited to the shapes illustrated in FIG. 7 and may have any shapes. The shape of the upper electrode 41a and the shape of the lower electrode 41c do not necessarily have to match each other in plan view. It is sufficient that the upper electrode 41a includes a portion that opposes at least a part of the lower electrode 41c. The shape of the dielectric layer 41b when viewed from the normal direction of the semiconductor substrate 2 may be arbitrarily set. The dielectric layer 41b may be a single continuous layer or may include a plurality of portions that are arranged at mutually different places in a single layer.

As illustrated in FIG. 7, the connector 50 may be arranged so as to penetrate the first capacitor 41 at the position of the opening 230 provided in the first capacitor 41. Arranging the connector 50 in the opening 230 increases the electrode area in the first capacitor 41 to make it easy to obtain a larger capacitance value, compared with a case in which the connector 50 is arranged between the first capacitors 41 in the pixels 10A that are adjacent to each other. This is because if the connector 50 is arranged between the adjacent pixels 10A, and the impurity region 2a in the semiconductor substrate 2 is connected to the photoelectric converter 15, it is necessary to increase the gap between the adjacent first capacitors 41, thus making it difficult to increase the electrode area in the first capacitor 41.

The first capacitor 41 may have two or more openings. However, when the pixel 10A has a connector other than the connector 50, such as a via that provides interconnection between the wiring layer located below the first capacitor 41 and the wiring layer located above the first capacitor 41, the connector may be arranged in an opening other than the opening 230 that the connector 50 penetrates. When a connector other than the connector 50 is arranged in an opening other than the opening 230, electrical coupling between the connector 50 and the connector other than the connector 50 can be suppressed or reduced by a part of the first capacitor 41 interposed therebetween, and noise mixing into the charge accumulation region can be suppressed.

In addition, an improvement in yield, suppression or reduction of shading, and so on can be expected by providing the opening 230 in the first capacitor 41. This point will be described below.

Figure 8:
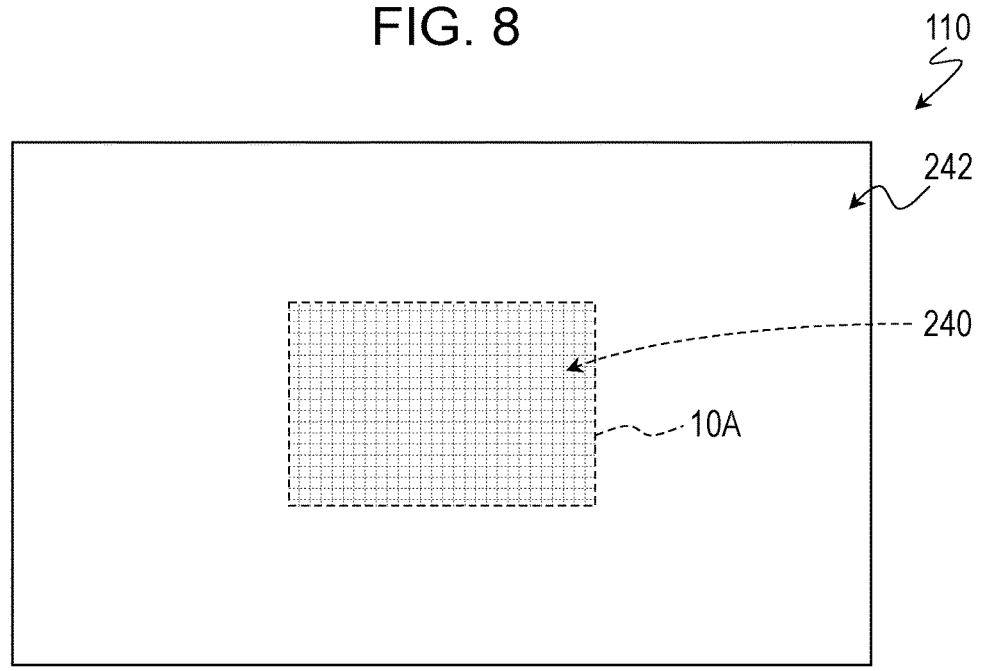
FIG. 8 is a plan view illustrating one example of a chip having a pixel region including a plurality of pixels.

FIG. 8 illustrates one example of a chip 110 having the pixel region 240 including the plurality of pixels 10A. As described above, the pixel region 240 may include about three-hundred thousand to 36 million pixels 10A. In the example illustrated in FIG. 8, the pixel region 240 is a region having a repeated structure of units each including the pixel 10A. As illustrated in FIG. 8, the chip 110 further has a peripheral region 242 that is located around and outside the pixel region 240 and in which the pixels 10A are not arranged. The peripheral region 242 may be a region on the above-described semiconductor substrate 2.

Figure 9:
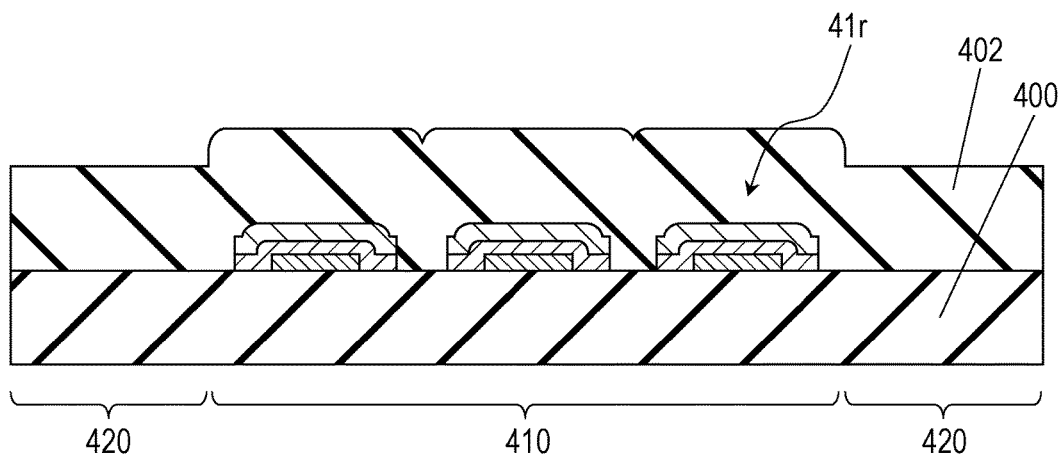
FIG. 9 is a schematic sectional view illustrating one manufacturing process for pixels in which MIM structures having no openings therein are included in an interlayer insulating layer.
Figure 10:
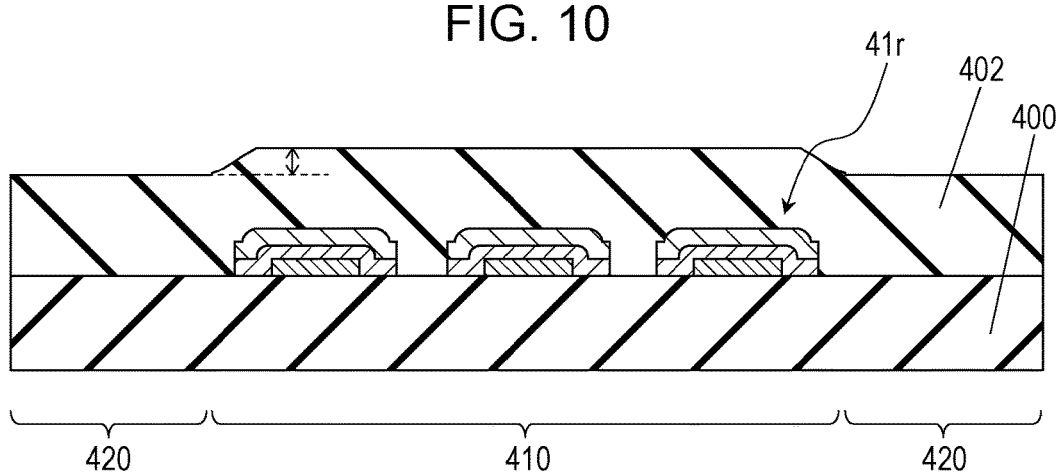
FIG. 10 is a schematic sectional view for illustrating another manufacturing process for the pixels in which the MIM structures having no openings therein are included in the interlayer insulating layer.

FIGS. 9 and 10 each illustrate, as a reference example, a part of a manufacturing process for pixels in which MIM structures having no opening therein are included in an interlayer insulating layer. When capacitors having MIM structures are arranged in an interlayer insulating layer, for example, MIM structures 41r are formed on an insulating layer 400, and then an insulating layer 402 that covers the MIM structures 41r is formed, as illustrated in FIG. 9. In this case, no openings are provided in the MIM structures 41r.

The thickness of each MIM structure 41r, that is, the distance from the lower surface of a lower electrode of each MIM structure 41r to the upper surface of an upper electrode thereof may be, for example, in a range that is larger than or equal to about 30 nm and is smaller than or equal to about 150 nm. Since the MIM structures 41r are arranged on a region 410 in which the pixel region 240 is to be formed, a level difference occurs on the upper surface of the insulating layer 402 between a region 420, which corresponds to the peripheral region 242, and the region 410. The size of the level difference, that is, the height difference between the portion that is included in the upper surface of the insulating layer 402 and that is on the region 410 and the portion that is included in the upper surface of the insulating layer 402 and that is on the region 420, may be in a range that is larger than or equal to 30 nm and is smaller than or equal to 150 nm depending on the thickness of the MIM structures 41r.

After the insulating layer 402 is formed, the upper surface of the insulating layer 402 is planarized by chemical mechanical polishing (CMP), etchback, or the like. However, when no openings are provided in the MIM structures, there are cases in which the level difference on the upper surface of the insulating layer 402 cannot be sufficiently reduced even by a planarization process. When the level difference on the upper surface of the insulating layer 402 is relatively large, focus displacement occurs in photolithography during formation of a wiring pattern and so on the insulating layer 402 to disable formation of a desired pattern or to cause, even when an image capture device is manufactured eventually, shading in an image that is acquired. In other words, the yield may decrease.

Figure 11:
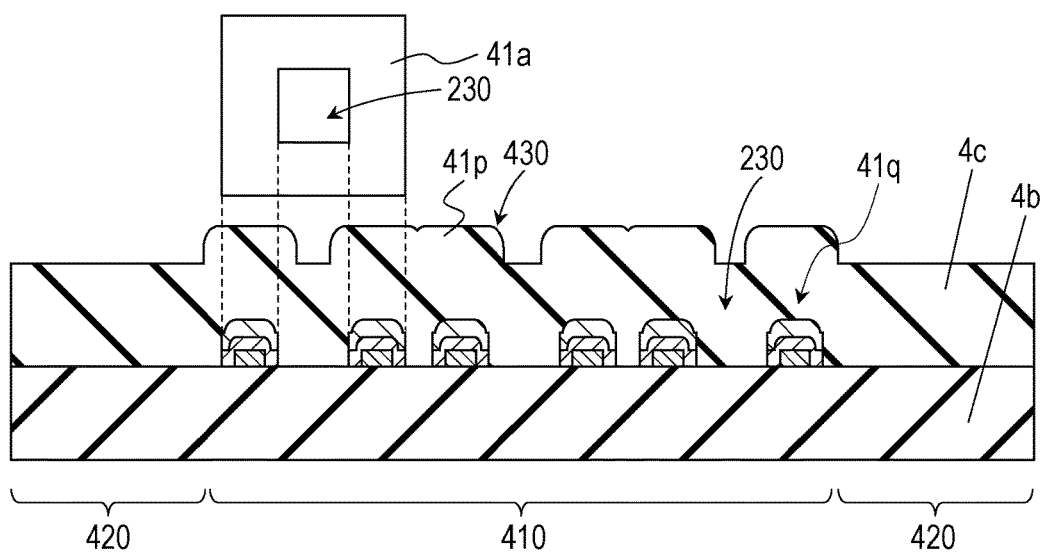
FIG. 11 is a schematic sectional view for illustrating one manufacturing process of a pixel using, as the first capacitors, MIM structures having openings therein.
Figure 12:
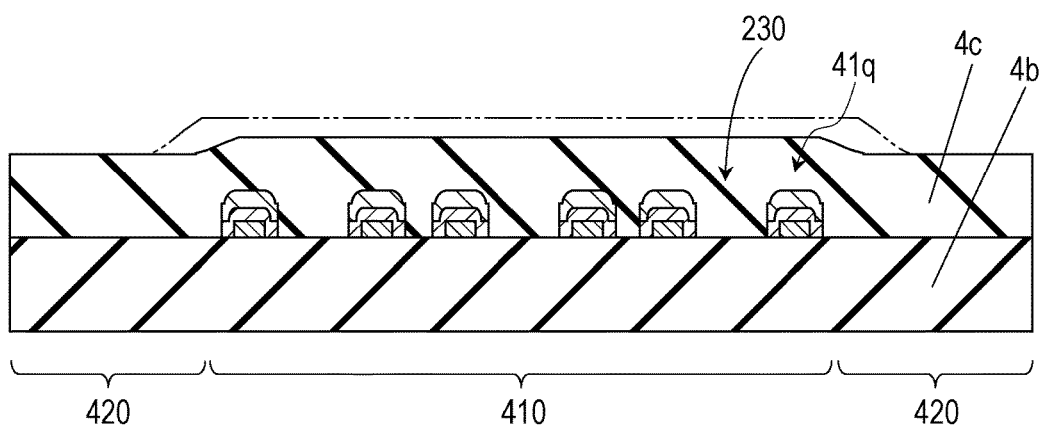
FIG. 12 is a schematic sectional view for illustrating another manufacturing process of the pixel using, as the first capacitors, MIM structures having openings therein.

FIGS. 11 and 12 each illustrate a part of a manufacturing process for pixels in which MIM structures 41q having openings 230 therein are employed as the first capacitors 41.

It is assumed in this case that, in plan view, the total area of the MIM structures 41q that occupy the entire pixel region 240 is equal to the total area of the MIM structures 41r that occupy the entire pixel region 240.

When the openings 230 are provided in the first capacitors 41, a large number of projection portions 41p having shoulder portions 430 are formed on portions included in the upper surface of an insulating layer 4c that covers the MIM structures 41q on the insulating layer 4b and that is located above the region 410, as schematically illustrated in FIG. 11. Since the upper surface of the insulating layer 4c has the large number of shoulder portions 430, a removal rate for the portion that is included in the upper surface of the insulating layer 4c and that is on the region 410 increases in the planarization process of the insulating layer 4c, compared with a flat portion on the region 420. This facilitates that the level difference on the upper surface of the insulating layer 4c is reduced, as schematically illustrated in FIG. 12, and makes it possible to suppress or reduce failures, such as focus displacement and shading generation in subsequent photolithography. FIG. 12 schematically illustrates a state after a planarization process is executed, and for comparison, the position of the upper surface of the insulating layer 402 illustrated in FIG. 10 is denoted by a long dashed double-short dashed line.

As described above, when the openings 230 are provided in the first capacitors 41, it is possible to reduce the level difference between the region that serves as the pixel region and the region that serves as the peripheral region, the level difference occurring on the upper surface of the insulating layer that covers the first capacitor 41. In other words, the formation of the openings 230 in the first capacitors 41 contributes to an improvement of flatness of the insulating layer that covers the first capacitor 41.

When the radius of the circle having an area that is equal to the opening area of each opening 230 in plan view is denoted by d, and the thickness of each first capacitor 41, that is, the distance between the lower surface of the lower electrode 41c and the upper surface of the upper electrode 41a is denoted by h, (d/h) may be larger than or equal to 1.4. Since providing the openings 230 in the first capacitors 41 improves the flatness of the upper surface of the insulating layer that covers the first capacitors 41, a wiring pattern and so on can be more reliably formed above the insulating layer. Accordingly, it is possible to improve the yield. Also, since the level difference on the interlayer insulating layer between the pixel region 240 and the peripheral region 242 in the image capture device decreases, it is possible to prevent an image quality reduction due to shading.

(Noise Canceling Utilizing Negative Feedback)

Now, an overview of noise canceling utilizing negative feedback will be described with reference to FIG. 2. An exemplary noise canceling operation, an overview thereof being described below, is executed, for example, subsequently to the so-called electronic shutter for resetting signal charge in the charge accumulation region before photography is started. Typically, the noise canceling operation is also executed after resetting signal charge accumulated in an exposure period subsequently to reading pixel signals after the exposure period is finished.

The reset of the signal charge after the exposure period is finished is executed in the following manner. First, exposure is executed in a state in which the reset transistor 36, the feedback transistor 38, and the address transistor 40 are off, and after the exposure period is finished, the address transistor 40 is turned on to thereby read a signal corresponding to signal charge accumulated in the exposure period.

Thereafter, the potentials in the reset signal line 26 and the feedback control lines 28 are controlled to thereby turn on the reset transistor 36 and the feedback transistor 38. As a result, the charge accumulation node 44 and the feedback line 25 are connected to each other via the reset transistor 36 and the feedback transistor 38 to form a feedback loop. The formation of the feedback loop is sequentially executed for each of the plurality of pixels 10A that share the feedback line 25.

As a result of the formation of the feedback loop, an output of the signal detection transistor 34 is negatively fed back. In this case, the feedback circuit 202 can be said to be a negative feedback amplifier circuit including the signal detection transistor 34, the inverting amplifiers 24, and the feedback transistor 38. The feedback transistor 38 corresponds to a third transistor in the present disclosure. As a result of the negative feedback of the output of the signal detection transistor 34, the potential at the charge accumulation node 44 converges to a potential at which the voltage of the vertical signal line 18 becomes equal to Vref. In other words, the potential at the charge accumulation node 44 is reset. It can also be said that the signal charge is reset.

In this example, it can also be said that the voltage Vref applied to the positive-side input terminal of the inverting amplifiers 24 corresponds to a reference voltage during resetting. A specific value of the voltage Vref can be arbitrarily set, for example, in a range between the power-supply voltage and a ground voltage, that is, 0 V. The power-supply voltage is, for example, 3.3 V.

Next, the reset transistor 36 is turned off. When the reset transistor 36 is turned off, kTC noise is generated. Thus, the kTC noise, which is associated with turning off of the reset transistor 36, is added to the voltage at the charge accumulation node 44 after the resetting. After the reset transistor 36 is turned off, the kTC noise is canceled in the following manner.

As can be understood from FIG. 2, the state in which the feedback loop is formed continues while the feedback transistor 38 is on. Thus, the kTC noise that is generated by turning off the reset transistor 36 is reduced to a magnitude $1/(1+A)$, where A represents the gain of the feedback circuit 202. In this example, the voltage of the vertical signal line 18 immediately before the reset transistor 36 is turned off, in other words, immediately before the noise canceling is started, is generally equal to the voltage Vref applied to the positive-side input terminal of the inverting amplifiers 24. When the voltage of the vertical signal line 18 before the noise canceling is started is brought close to the target voltage Vref after the noise canceling, the kTC noise can be canceled in a relatively short period of time.

Next, the feedback transistor 38 is turned off. When the feedback transistor 38 is turned off, kTC noise is generated. However, the magnitude of the kTC noise that is applied to the voltage at the charge accumulation node 44, the noise being caused by turning off the feedback transistor 38, is $(Cfd/C1)^{1/2} \times (C2/(C2+Cfd))$ times of a magnitude in a case in which the first capacitor 41 and the second capacitor 42 are not provided in the pixel 10A, and the feedback transistor 38 is directly connected to the charge accumulation node 44. In the mathematical expression, Cfd, C1, and C2 represent the capacitance value of the charge accumulation node 44, the capacitance value of the first capacitor 41, and the capacitance value of the second capacitor 42, respectively, and "×" represents multiplication.

It can be understood from the above-noted expression that the larger the capacitance value C1 of the first capacitor 41, the smaller the magnitude of noise that is generated, and the smaller the capacitance value C2 of the second capacitor 42, the larger the decay rate. Accordingly, appropriately setting the capacitance value C1 of the first capacitor 41 and the capacitance value C2 of the second capacitor 42 makes it possible to sufficiently reduce the amount of kTC noise that is generated by turning off the feedback transistor 38.

After the feedback transistor 38 is turned off, a signal in which the kTC noise is canceled is read. The level of the signal obtained at this point corresponds to a signal level during dark time. Since the amount of time taken for reading a reset voltage is small, the signal reading after the noise canceling may be executed while the on state of the address transistor 40 continues. Determining a difference between the signal read at this point and a signal read after exposure and before the start of the resetting provides a signal in which fixed noise is eliminated. In such a manner, a signal in which the kTC noise and the fixed noise are eliminated is obtained.

In a state in which the reset transistor 36 and the feedback transistor 38 are turned off, the first capacitor 41 is connected to the charge accumulation node 44 via the second capacitor 42. Now, suppose a case in which the charge accumulation node 44 and the first capacitor 41 are directly connected to each other without use of the second capacitor 42. In this case, the capacitance value in the entire accumulation region of signal charge when the first capacitor 41 is directly connected is (Cfd+C1). That is, when the first capacitor 41 has a relatively large capacitance value C1, the capacitance value of the entire signal-charge accumulation region also increases, and thus a high conversion gain is not obtained. That is, it is difficult to obtain a high signal-to-noise (S/N) ratio.

Meanwhile, when the first capacitor 41 is connected to the charge accumulation node 44 via the second capacitor 42, as illustrated in FIG. 2, the capacitance value of the entire signal-charge accumulation region in such a configuration is given by (Cfd+(C1C2)/(C1+C2)). In this case, when the second capacitor 42 has a relatively small capacitance value C2, and the first capacitor 41 has a relatively large capacitance value C1, the capacitance value of the entire signal-charge accumulation region is approximately (Cfd+C2). That is, an increase in the capacitance value of the entire signal-charge accumulation region is small. Connecting the first capacitor 41 to the charge accumulation node 44 via the second capacitor 42 having a relatively small capacitance value, as described above, makes it possible to suppress or reduce a reduction in the conversion gain.

MODIFICATIONS

As described above with reference to FIG. 3, for electrical isolation, typically, the second electrode 15c in each pixel 10A is spatially isolated from the second electrode 15c in another pixel 10A adjacent thereto. Thus, in general, gaps exists between the second electrodes 15c that are adjacent to each other. Accordingly, there are cases in which light that has passed through the gaps repeats diffused reflection in the pixels 10A and reaches the impurity regions 2a or the impurity regions 2b in the semiconductor substrate 2.

For example, using a light-shielding electrode as the upper electrode 41a and/or the lower electrode 41c in the first capacitor 41 to make the electrode area of the first capacitor 41 in plan view larger than the area of the second electrode 15c in the photoelectric converter 15 makes it possible to reduce the gaps between the pixels 10A and to reduce stray light. In particular, the upper electrodes 41a are each configured so that a predetermined voltage is supplied thereto through the corresponding sensitivity adjustment line 32, the distance between the upper electrodes 41a that are adjacent to each other can be sufficiently reduced compared with the distance between the second electrodes 15c that are adjacent to each other. With such a configuration, however, since light can pass through the gaps formed between the upper electrodes 41a that are adjacent to each other, it is difficult to completely eliminate the stray light.

Figure 13:
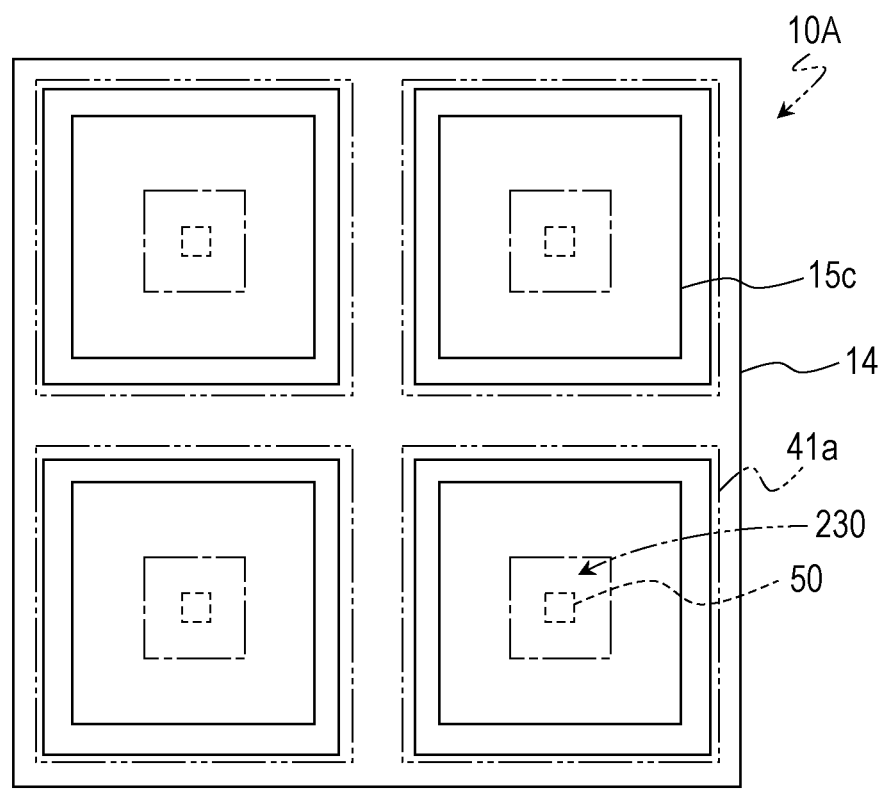
FIG. 13 is a plan view illustrating a modification of the image capture device.
Figure 14:
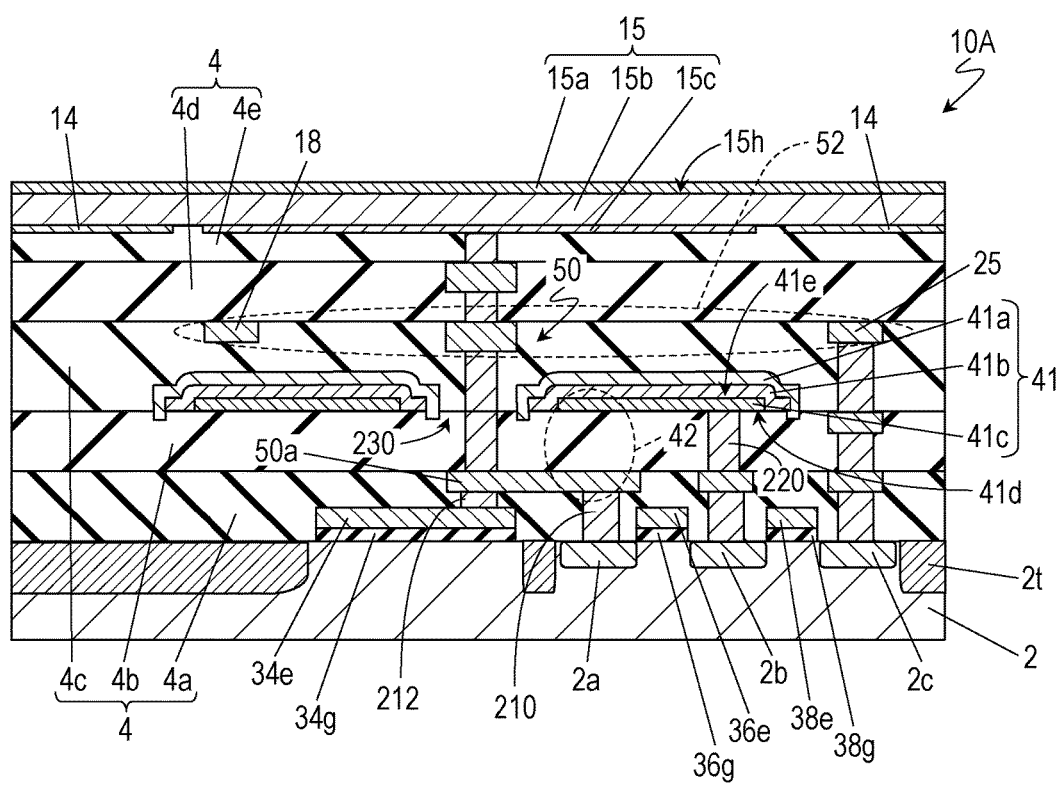
FIG. 14 is a schematic sectional view illustrating the modification of the image capture device.

FIGS. 13 and 14 illustrate a modification of the image capture device 100. FIG. 14 is a schematic sectional view corresponding to FIG. 13. As illustrated in FIG. 14, for example, a shield electrode 14 may be arranged in the same layer of the second electrode 15c in the photoelectric converter 15.

FIG. 13 illustrates an example of an arrangement of the upper electrodes 41a, the second electrodes 15c, and the shield electrode 14 when the photoelectric conversion layer 15b and the first electrode 15a are removed from the pixels 10A, and the resulting structure is viewed from the normal direction of the semiconductor substrate 2. In the illustrated example, the shield electrode 14 is formed in a grid including a plurality of portions that extend along the boundary between the pixels 10A in plan view and covers the gaps between two upper electrodes 41a that are adjacent to each other. When the gaps between the two upper electrodes 41a that are adjacent to each other are covered with the shield electrode 14, it is possible to further reduce light incidence on the gaps between the two upper electrodes 41a that are adjacent to each other, and it is possible to further reduce stray light.

The shield electrode 14 is configured so that a constant voltage is supplied thereto during operation of the image capture device 100. Thus, a gap for electrical insulation is provided between the second electrode 15c and the shield electrode 14. Most of light that passes through the gap between the second electrode 15c and the shield electrode 14 can be blocked by the upper electrode 41a or the lower electrode 41c in the first capacitor 41. Each of a plurality of strip-shaped electrodes that extend through a plurality of columns in the row direction may be used as the upper electrode 41a. In this case, since the gaps between the upper electrodes 41a in the adjacent pixels 10A along the row direction are not generated, it is possible to further reduce stray light.

Also, when a shield electrode maintained at a constant potential is provided between the pixels, it is possible to prevent charge generated in the photoelectric conversion layer 15b in one of the pixels from being collected by the second electrode 15c in another pixel different from that pixel. For example, charge that is generated in the vicinity of the boundary of one pixel and that moves toward a pixel electrode that is different from a pixel electrode to which the charge is supposed to move, for example, that moves to a pixel electrode in an adjacent pixel, can be collected by the shield electrode 14. Accordingly, unintended charge transfer to the adjacent pixels is suppressed or reduced, and occurrence of color mixing is reduced.

Second Embodiment

Figure 15:
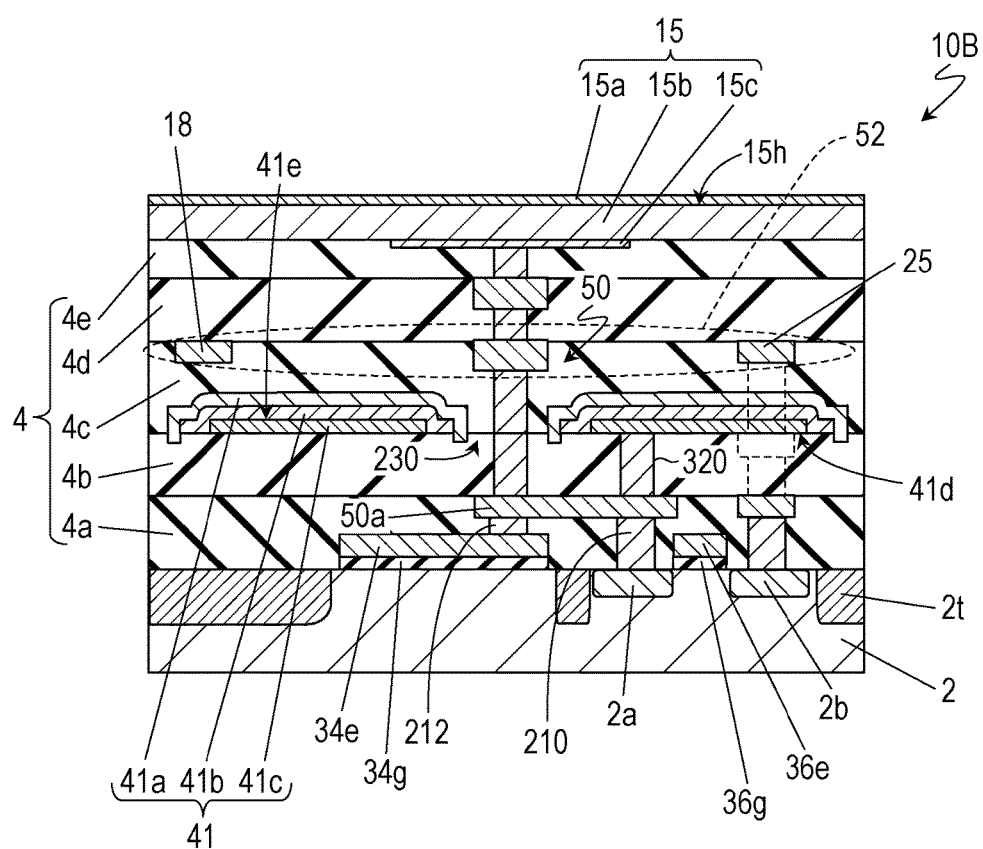
FIG. 15 is a schematic sectional view of one pixel in an image capture device according to another embodiment of the present disclosure.

FIG. 15 schematically illustrates a section of pixels in an image capture device according to a second embodiment of the present disclosure. A major difference between the above-described pixel 10A and a pixel 10B illustrated in FIG. 15 is that the pixel 10B lacks the second capacitor 42, and the lower electrode 41c in the first capacitor 41 is connected to the connector 50 through a via 320 without use of the reset transistor 36.

In the configuration illustrated in FIG. 15, the via 320 is located between the lower electrode 41c and the wire 50a in the connector 50, and one end of the via 320 is connected to the lower surface 41d of the lower electrode 41c. What is common to the above-described embodiment and the second embodiment is that a contact is provided at the lower surface 41d side of the lower electrode 41c, and the portion above the lower electrode 41c is covered with the upper electrode 41a. The via 320 connected to the connector 50 can function as a part of a charge accumulation region. That is, provision of the via 320 between the lower electrode 41c and the connector 50 provides an advantage of increasing the capacitance value of the charge accumulation region.

In a configuration in which the lower electrode 41c in the first capacitor 41 is connected to the connector 50 through the via 320, the maximum amount of charge that can be accumulated in the entire charge accumulation region increases, as the capacitance value of the first capacitor 41 increases. When the maximum amount of charge that can be accumulated in the entire charge accumulation region is large, it is advantageous for photography under high illuminance.

Even when the upper electrode 41a is connected to the connector 50, and the lower electrode 41c is connected to the sensitivity adjustment line 32 (not illustrated in FIG. 15), the first capacitor 41 can also be connected to the connector 50 without use of the reset transistor 36. However, when the lower electrode 41c is connected to the connector 50, and the lower electrode 41c is covered with the upper electrode 41a, as in the configuration illustrated in FIG. 15, it is possible to suppress or reduce electrical coupling, for example, between a wiring layer, such as the wiring layer 52, arranged above the upper electrode 41a and the lower electrode 41c, and thus, an effect of noise reduction can be expected compared with a case in which the upper electrode 41a is connected to the connector 50. When the upper electrode 41a is shaped to cover a side surface that connects the upper surface 41e of the lower electrode 41c and the lower surface 41d thereof, the effect of the coupling reduction can be further improved.

Figure 16:
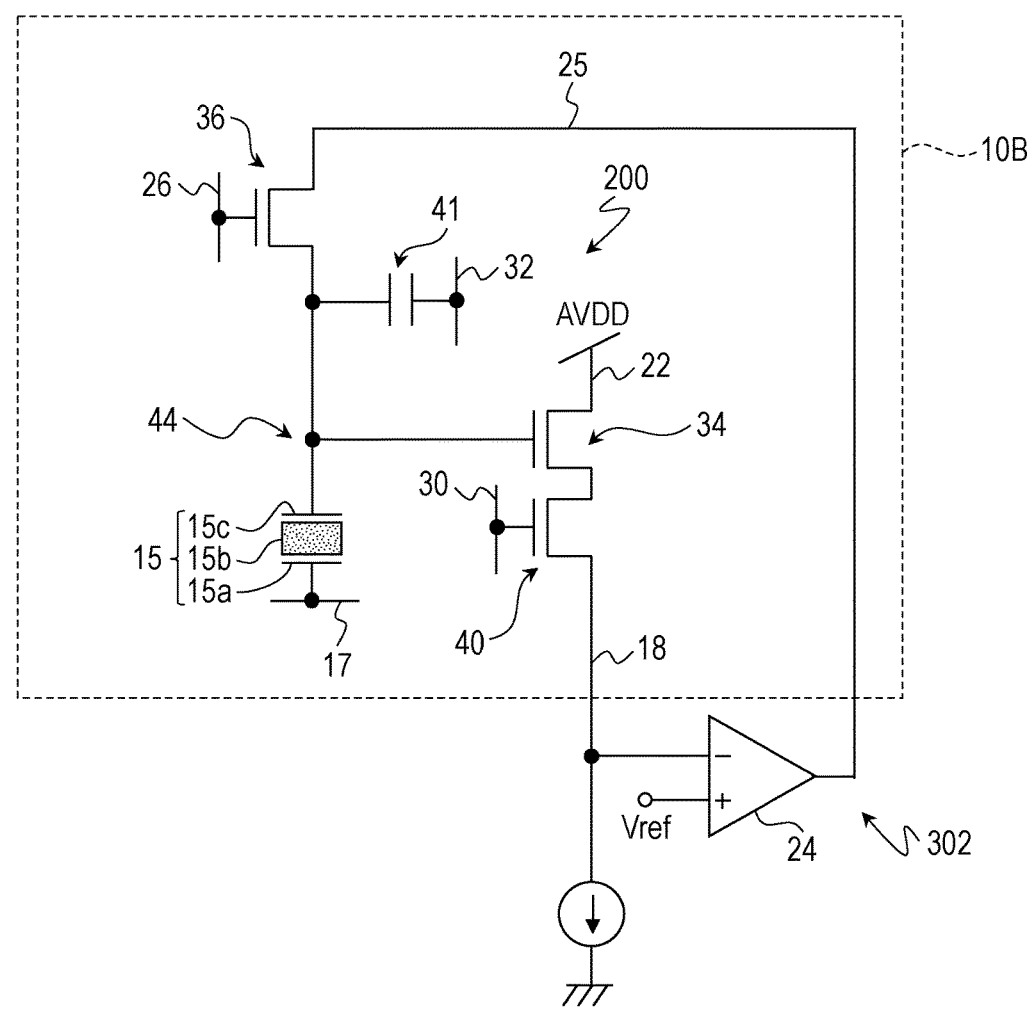
FIG. 16 is a diagram illustrating an exemplary circuit configuration of the pixel illustrated in FIG. 15.

FIG. 16 is a diagram illustrating an exemplary circuit configuration of the pixel 10B illustrated in FIG. 15. As illustrated in FIG. 16, one of the drain and the source of the reset transistor 36 is connected to the charge accumulation node 44, and the other drain or source is connected to the feedback line 25 without use of the feedback transistor 38 in the first embodiment. Also, of the electrodes of the first capacitor 41, the electrode that is not connected to the sensitivity adjustment lines 32 is connected to the charge accumulation node 44.

(Noise Canceling Using Negative Feedback)

A noise canceling operation in the circuit configuration illustrated in FIG. 16 will be described next. In this case, a feedback circuit 302 illustrated in FIG. 16 is a negative feedback amplifier circuit including the signal detection transistor 34, the inverting amplifiers 24, and the reset transistor 36. As can be understood from the following description, the reset transistor 36 described in an example described below can be said to also have the functions of the feedback transistor 38 in the first embodiment.

For example, after the exposure period is finished, the reset transistor 36 is turned on. When the reset transistor 36 is turned on, the charge accumulation node 44 and the feedback line 25 are connected to each other via the reset transistor 36 to form a feedback loop for feeding back a signal of the photoelectric converter 15. In this case, a signal of the photoelectric converter 15 is negatively fed back.

When the charge accumulation node 44 and the feedback line 25 are electrically connected to each other, the potential at the charge accumulation node 44 converges to a potential at which the voltage of the vertical signal line 18 becomes equal to Vref. In other words, the potential at the charge accumulation node 44 is reset.

Thereafter, the reset transistor 36 is turned off, and noise canceling is executed. In this case, the potential in the reset signal line 26 is gradually reduced from a high level to a low level so as to cross a threshold voltage of the reset transistor 36.

When the potential in the reset signal line 26 is gradually reduced from the high level to the low level, the reset transistor 36 changes from an on state to an off state gradually. While the reset transistor 36 is on, the state in which the feedback loop is formed continues. At this point, the resistance of the reset transistor 36 increases, as the voltage applied to the reset signal line 26 decreases. When the resistance of the reset transistor 36 increases, the operating band of the reset transistor 36 decreases, and the frequency domain of signals that are fed back becomes small.

When the voltage applied to the reset signal line 26 reaches the low level, the reset transistor 36 is turned off. That is, the formed feedback loop is canceled. When the reset transistor 36 is turned off in a state in which the operating band of the reset transistor 36 is lower than the operating band of the signal detection transistor 34, kTC noise that remains at the charge accumulation node 44 can be reduced.

In this example, the voltage of the vertical signal line 18 immediately before the voltage applied to the reset signal line 26 is changed to the low level, that is, immediately before the noise canceling is started, is generally equal to the voltage Vref applied to a non-inverting input terminal of the inverting amplifier 24. Thus, when the voltage of the vertical signal line 18 when the noise canceling is started is brought close to the target voltage Vref after the noise canceling, canceling of kTC noise can be completed in a relatively short period of time even with control for gradually reducing the voltage applied to the reset signal line 26.

Each of the signal detection transistor 34, the reset transistor 36, the address transistor 40, and the feedback transistor 38 described above may be an N-channel MOSFET or a P-channel MOSFET. All of those transistors do not have to be either an N-channel MOSFET or a P-channel MOSFET.

What is claimed is:

1. An image capture device comprising:
a pixel region including a plurality of pixels; and
a signal line that is arranged across two or more pixels of the plurality of pixels and that extends from an inside of the pixel region to an outside of the pixel region, wherein:
each of the plurality of pixels includes
a semiconductor substrate,
a photoelectric converter supported by the semiconductor substrate and including
a first electrode,
a second electrode arranged closer to the semiconductor substrate than the first electrode, and
a photoelectric conversion layer disposed between the first electrode and the second electrode,
a first transistor including a first impurity region arranged in the semiconductor substrate and a second impurity region arranged in the semiconductor substrate,
a wiring layer arranged between the semiconductor substrate and the second electrode and including a part of the signal line, and
a capacitor arranged between the wiring layer and the semiconductor substrate in a normal direction of the semiconductor substrate and including
a third electrode,
a fourth electrode arranged between the third electrode and the semiconductor substrate, and
a dielectric layer arranged between the third electrode and the fourth electrode,
one of the first impurity region and the second impurity region is configured to function as a source region of the first transistor,
the other of the first impurity region and the second impurity region is configured to function as a drain region of the first transistor,
the first impurity region is electrically connected to the second electrode,
the fourth electrode is electrically connected to one of the first impurity region and the second impurity region, and
at least one electrode selected from the group consisting of the third electrode and the fourth electrode covers the first impurity region when viewed along the normal direction of the semiconductor substrate.

2. The image capture device according to claim 1, wherein each of the plurality of pixels further includes a second transistor including a gate electrode electrically connected to the second electrode.

3. The image capture device according to claim 1, wherein the at least one electrode selected from the group consisting of the third electrode and the fourth electrode covers at least a part of the second impurity region when viewed along the normal direction.

4. The image capture device according to claim 2, further comprising:
a connector that electrically connects the second electrode to the first impurity region and electrically connects the second electrode to the gate electrode of the second transistor.

5. The image capture device according to claim 4, wherein at least one electrode selected from the group consisting of the third electrode and the fourth electrode includes an opening.

6. The image capture device according to claim 5, wherein the connector penetrates the opening.

7. The image capture device according to claim 4, wherein:
the fourth electrode has a first surface that faces the third electrode and a second surface that is opposite to the first surface, and is electrically connected to the second impurity region,
and at least a part of the connector faces the second surface and extends in a plane orthogonal to the normal direction of the semiconductor substrate.

8. The image capture device according to claim 7, wherein the second surface of the fourth electrode is electrically connected to the second impurity region.

9. The image capture device according to claim 7, further comprising:
a feedback circuit that negatively feeds back an output of the second transistor, wherein:

the feedback circuit includes a third transistor including a source and a drain, and one of the source and the drain is connected to the second impurity region.

10. The image capture device according to claim 4, wherein the fourth electrode has a first surface that faces the third electrode and a second surface that is opposite to the first surface, and is electrically connected to the connector.

11. The image capture device according to claim 10, wherein the second surface of the fourth electrode is connected to the connector.

12. The image capture device according to claim 10, further comprising:

a feedback circuit that negatively feeds back an output of the second transistor, wherein the second impurity region is electrically connected to an output line of the feedback circuit.

13. The image capture device according to claim 7, wherein:

the dielectric layer covers the first surface and a side surface of the fourth electrode, the side surface connecting the first surface and the second surface, and the third electrode covers the side surface of the fourth electrode.

14. The image capture device according to claim 1, wherein the signal line is a control line through which the two or more pixels are driven, a power-supply line through which a voltage is supplied to the two or more pixels, or an output line through which signals are read from the two or more pixels.

15. The image capture device according to claim 1, wherein the at least one electrode selected from the group consisting of the third electrode and the fourth electrode covers all of the first impurity region when viewed along the normal direction of the semiconductor substrate.

* * * * *